(12) United States Patent
Hsu et al.

(10) Patent No.: US 10,312,073 B2
(45) Date of Patent: Jun. 4, 2019

(54) SELECTIVE REMOVAL OF CARBON-CONTAINING AND NITROGEN-CONTAINING SILICON RESIDUES

(71) Applicant: Taiwan Semiconductor Manufacturing Company, Ltd., Hsinchu (TW)

(72) Inventors: Yao-Wen Hsu, New Taipei (TW); Jian-Jou Lian, Tainan (TW); Neng-Jye Yang, Hsinchu (TW); Kuan-Lin Chen, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/870,603

(22) Filed: Jan. 12, 2018

(65) Prior Publication Data
US 2018/0315593 A1     Nov. 1, 2018

Related U.S. Application Data

(60) Provisional application No. 62/491,976, filed on Apr. 28, 2017.

(51) Int. Cl.
*H01L 21/3065* (2006.01)
*H01L 21/02* (2006.01)
(Continued)

(52) U.S. Cl.
CPC ........ *H01L 21/02068* (2013.01); *C11D 3/044* (2013.01); *C11D 7/505* (2013.01);
(Continued)

(58) Field of Classification Search
CPC . G06F 15/7825; H04L 12/50; H04L 12/6402; H04L 12/66; H04L 47/724;
(Continued)

(56) References Cited

U.S. PATENT DOCUMENTS 7,087,563 B2 *   8/2006   Iwamoto ............... G03F 7/422
                                            134/1.3
2007/0037087 A1 *  2/2007  Yokoi ................... G03F 7/423
                                            430/256
(Continued)

*Primary Examiner* — Lan Vinh
(74) *Attorney, Agent, or Firm* — Slater Matsil, LLP

(57) ABSTRACT

A semi-aqueous wet clean system and method for removing carbon-containing silicon material (e.g., plasma residue) or nitrogen-containing silicon material (e.g., plasma residue) includes a hydroxyl-terminated organic compound, a diol, and a fluoride ion donor material. The system is configured to protect silicon oxide and amorphous silicon during a post-dry-etch wet clean. The wet clean system is configured to selectively remove carbon-containing or nitrogen-containing plasma residue. pH of the wet clean system can be modified to tune selectivity for removal of carbon-containing or nitrogen-containing plasma residues. As a result, positive TEOS recession of less than about 3 nanometers may be achieved. Additionally, the wet clean system can be adapted for reclamation and subsequent reuse.

20 Claims, 29 Drawing Sheets

(51) Int. Cl.
  *C11D 7/50* (2006.01)
  *C11D 3/04* (2006.01)
  *H01L 21/033* (2006.01)
  *C23F 1/10* (2006.01)
  *C23F 1/16* (2006.01)

(52) U.S. Cl.
  CPC .... H01L 21/02063 (2013.01); H01L 21/0337 (2013.01); H01L 21/3065 (2013.01); *C23F 1/10* (2013.01); *C23F 1/16* (2013.01)

(58) Field of Classification Search
  CPC ............... H04L 49/109; H04L 49/3018; H04L 49/3027; H01L 21/302; H01L 21/30617; H01L 21/02068; H01L 21/3065; C11D 3/044; C11D 7/505; C09G 1/00; C23F 1/10; C23F 1/14; C23F 1/16
  USPC .... 252/79.1, 79.2, 79.3, 79.4; 438/745, 750, 438/752, 756; 134/1.1, 1.2, 1.3, 3
  See application file for complete search history.

(56) References Cited

U.S. PATENT DOCUMENTS

| | | | | |
|---|---|---|---|---|
| 2009/0281017 A1* | 11/2009 | Suzuki | ................ | G03F 7/425 |
| | | | | 510/176 |
| 2014/0227881 A1* | 8/2014 | Lubomirsky | ..... | C23C 16/45565 |
| | | | | 438/710 |
| 2016/0186105 A1* | 6/2016 | Liu | .................. | C11D 11/0047 |
| | | | | 510/175 |
| 2016/0351388 A1* | 12/2016 | Liu | ................. | H01L 21/02074 |
| 2017/0260632 A1* | 9/2017 | Kodera | ................ | C23F 1/18 |

* cited by examiner

SELECTIVE REMOVAL OF CARBON-CONTAINING AND NITROGEN-CONTAINING SILICON RESIDUES

RELATED APPLICATIONS AND PRIORITY

This application claims the benefit of U.S. Provisional Patent Application No. 62/491,976, filed on 28 Apr. 2017, entitled "SELECTIVE REMOVAL OF CARBON-CONTAINING AND NITROGEN-CONTAINING SILICON RESIDUES," which application is hereby incorporated herein by reference in its entirety.

BACKGROUND

With increasing down-scaling of semiconductor devices, various processing techniques (e.g., photolithography) have been adapted to allow for the manufacture of devices with increasingly smaller dimensions; however, with smaller processing windows, manufacture of these devices has surpassed theoretical limits of photolithography. As semiconductor devices continue to shrink, desired spacing between elements of a device has become less than a pitch that can be manufactured using traditional optical masks and photolithographic techniques.

BRIEF DESCRIPTION OF THE DRAWINGS

For a more complete understanding of representative embodiments, and advantages thereof, reference is now made to the following description taken in conjunction with the accompanying drawings, in which.

DETAILED DESCRIPTION

Figure 1A:
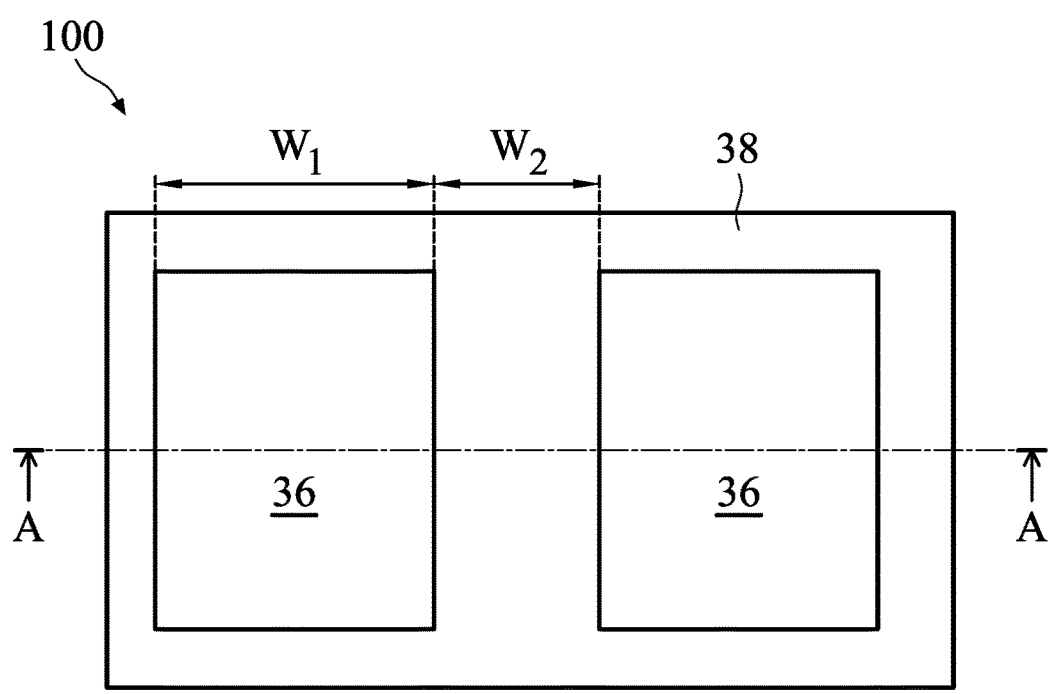
FIGS. 1A, 1B, 2A, 2B, 3A, 3B, 4A, 4B, 5A, 5B, 6A, 6B, 7A, 7B, 8A, 8B, 9, and to are top-views and cross-sectional views of intermediate stages in the patterning of a semiconductor device in accordance with an embodiment.

Reference will be made to representative embodiments illustrated in the accompanying drawings. Wherever possible, same reference numbers are used in the drawings and description to refer to same or similar parts. Shapes, sizes, and thicknesses may be exaggerated for clarity or convenience of description. This description is directed to particular elements forming part of, or cooperating more directly with, methods and systems in accordance with the present disclosure. It will be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the indicated embodiment is included in at least one embodiment. Thus, appearances of the phrases "in one embodiment" or "in an embodiment" in various places throughout this specification are not necessarily referring to the same embodiment. Furthermore, particular features, structures, or characteristics may be combined in any suitable manner in one or more embodiments to derive alternative, conjunctive, or sequential embodiments. It should be appreciated that the figures are not drawn to scale; rather, the figures are merely intended for representative illustration.

With increasing down-scaling of integrated circuit devices, optical proximity effects pose a greater challenge for transferring patterns from a photolithography mask to a wafer. When two discrete features are closely spaced on the order of a wavelength of electromagnetic radiation used for pattern imaging, optical proximity effects may cause adjacent features to short between one another. Double-patterning technology has been introduced for enhancing feature definition to address such challenges. Two-pattern-two-etch (2P2E) is one such technology.

In 2P2E processing, closely-spaced features are separated into two (or more) lithography masks, where the plural lithography masks are used to expose a same photoresist or two different photoresists, such that patterns for closely-spaced features may be transferred to a same layer. In each of the double-patterning lithography masks, distances between features are increased over the distances between the features in an otherwise single-pattern mask, so as to be suitably larger than a wavelength of electromagnetic radiation used to expose the pattern. In the case of using two lithography masks, the resolution of composite imaging is effectively doubled. Consequently, distances in multiple-patterning lithography masks are typically greater than threshold distances for the onset of optical proximity effects; and hence, substantially reduce challenges associated with such effects.

Embodiments will be described with respect to a system and method for selectively removing carbon-containing and nitrogen-containing silicon residues produced from dry etch processing attending production of a multi-patterned semiconductor device. A representative semiconductor device is produced by patterning a semiconductor device layer by transferring multiple patterns to multiple hard mask layers over the semiconductor device layer. At least one of the patterns includes a sidewall-aligned spacer that is conformally deposited over mandrels.

Figure 1B:
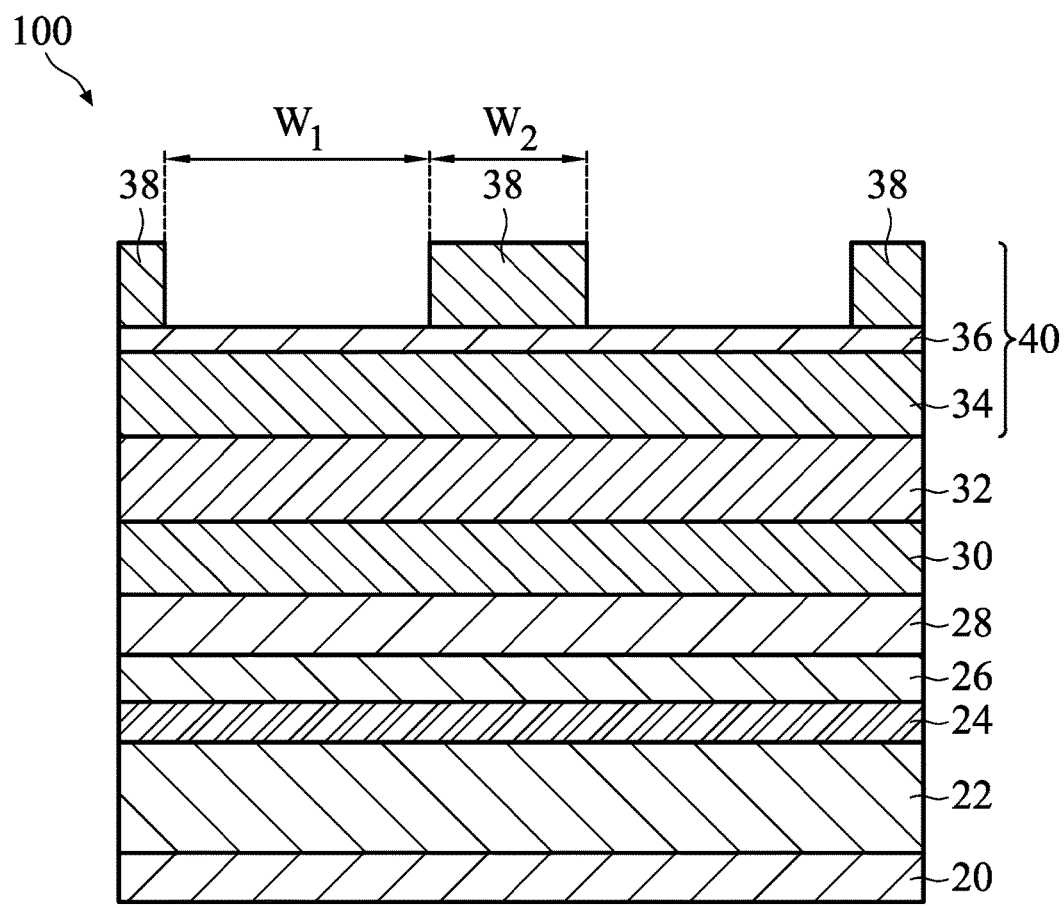

FIG. 1A through to are cross-sectional views of intermediate stages in patterning a semiconductor device 100 in accordance with an embodiment. FIGS. 1A and 1B illustrate a top view and a cross-sectional view, respectively, of semiconductor device 100 at an intermediate stage of processing. FIG. 1B is a cross-sectional view along the line A-A in FIG. 1A. FIGS. 2B through 8B and 11B through 15B are also cross-sectional views along the same line A-A in each of respective top views (FIGS. 2A through 8A and 11A through 15A), although the line A-A is not shown in these subsequent Figures.

Referring to FIGS. 1A and 1B, semiconductor device 100 includes an optional etch stop layer (ESL) 20, a semiconductor device layer 22, an anti-reflective coating (ARC) 24, hard mask layers 26, 28, 30, and 32, and a tri-layer photoresist 40 over the hard mask layers 26-32. In some embodiments, hard mask layer 26 may comprise titanium nitride, hard mask layer 28 may comprise TEOS, mandrel layer 30 may comprise amorphous silicon, and mandrel layer 32 may comprise silicon nitride. In an embodiment, hard mask layer 26 is titanium oxide. In another embodiment, hard mask layer 28 is $SiO_xC_y$. In another embodiment, mandrel layer 30 is $AlO_xN_y$. In another embodiment, mandrel layer 32 is SiON.

Semiconductor device layer 22 is a layer to be patterned. In some embodiments, semiconductor device layer 22 is a metallic layer to be used for metal lines and is made of copper, aluminum, the like, or a combination thereof. In other embodiments, semiconductor device layer 22 may be a dielectric layer, such as, e.g., a low-k dielectric layer, a polymer layer, or the like. In yet other embodiments, semiconductor device layer 22 is a substrate, and is made of a semiconductor material, such as, e.g., silicon, germanium, diamond, or the like. Alternatively or conjunctively, compound materials, such as, e.g., silicon germanium, silicon carbide, gallium arsenic, indium arsenide, indium phosphide, silicon germanium carbide, gallium arsenic phosphide, gallium indium phosphide, combinations of these, or the like, may be used. In embodiments where semiconductor device layer 22 is a substrate, ESL 20 may be omitted. In embodiments where semiconductor device layer 22 is not a substrate, a substrate (not shown) may be disposed below optional ESL 20. A substrate (not shown) disposed below optional ESL 20 may be formed of similar materials as those described above for semiconductor device layer 22.

The substrate (not shown) disposed below optional ESL 20, or in embodiments where semiconductor device layer 22 is a substrate, may include active and passive devices (not shown). As one skilled in the art will appreciate, a wide variety of devices, such as, e.g., transistors, capacitors, resistors, combinations of these, or the like, may be used to provide structural or functional features of a design for semiconductor device 100. Active and passive devices may be formed using any suitable methods, whether now known or hereafter derived in the art.

ARC 24 may be formed over semiconductor device layer 22. ARC 24 prevents or otherwise reduces radiation in subsequent photolithographic processes from reflecting off underlying layers and interfering with exposure. Such interference can increase critical dimensions of the photolithography process. ARC 24 may be alternatively referred to as an anti-reflective layer (ARL) 24. In some embodiments, ARC 24 comprises a nitrogen-free ARC (NFARC) 24 and may be formed from a silicon-rich oxide (SRO), silicon oxycarbide, the like, or a combination thereof. In some embodiments, ARC 24 is formed by chemical vapor deposition (CVD), plasma enhanced CVD (PECVD), the like, or a combination thereof.

Hard mask layers 26, 28, 30, and 32 are formed over ARC 24. In an embodiment, hard mask layer 26 comprises a metal hard mask layer, and hard mask layers 28, 30, and 32 comprise dielectric hard mask layers. In subsequent processing steps, a pattern is transferred to hard mask layer 26 using various photolithography and etching techniques. Hard mask layer 26 may then be used as a patterning mask for etching underlying ARC 24 and semiconductor device layer 22. In a representative aspect, hard mask layer 26 may comprise a masking material, such as, e.g., titanium nitride, titanium oxide, the like, or a combination thereof. Hard mask layer 26 may be formed using a process, such as, e.g., CVD, physical vapor deposition (PVD), atomic layer deposition (ALD), the like, or a combination thereof. In an embodiment, hard mask layer 26 may be formed to have a thickness from about 100 Angstroms to about 500 Angstroms.

Hard mask layer 28 may be deposited over hard mask layer 26. Hard mask layer 28 may be used as a masking pattern for hard mask layer 26. In subsequent processing steps, hard mask layer 28 is patterned with multiple patterns (see, e.g., FIGS. 8A and 8B) which may then be transferred to hard mask layer 26. Hard mask layer 28 may comprise a masking material, such as, e.g., tetraethyl orthosilicate (TEOS), $SiO_xC_y$, the like, or a combination thereof. Hard mask layer 28 may be formed using a process, such as, e.g., CVD, ALD, the like, or a combination thereof. In an embodiment, hard mask layer 28 may be formed to have a thickness from about 100 Angstroms to about 1000 Angstroms.

Hard mask layer 30 is formed over hard mask layer 28. Hard mask layer 30 may be used to form mandrels 30' (see, e.g., FIG. 5B) and will be referred to as mandrel layer 30 hereinafter. Mandrel layer 30 may comprise a masking material, such as, e.g., amorphous silicon, or any other material that may be patterned and selectively removed. Mandrel layer 30 may be formed using a process, such as, e.g., CVD, ALD, the like, or a combination thereof. In an embodiment, hard mask layer 30 may be formed to have a thickness from about 100 Angstroms to about 1000 Angstroms.

Hard mask layer 32 is formed over mandrel layer 30. Hard mask layer 32 may be used to form mandrels 32' (see, e.g., FIG. 2B) and will be referred to as mandrel layer 32 hereinafter. Mandrel layer 32 may comprise a masking material, such as, e.g., a silicon nitride, silicon oxynitride, the like, or a combination thereof or any other material that may be patterned and selectively removed. Mandrel layer 32 may be formed using a process, such, e.g., as CVD, ALD, the like, or a combination thereof. In an embodiment, hard mask layer 32 is formed to have a thickness from about 100 Angstroms to about 1000 Angstroms.

Tri-layer photoresist 40 is formed over mandrel layer 32. Tri-layer photoresist 40 includes a top photoresist layer 38, a middle layer 36, and a bottom layer 34. As the limits of photolithography processes are reached by advanced semiconductor manufacturing processes, the need for thinner top photoresist layers has arisen to achieve smaller process windows. However, thin top photoresist layers may not be sufficiently robust to support the etching of target layers (e.g., the mandrel layer 32). Tri-layer photoresist provides a relatively thin top photoresist layer 38. Middle layer 36 may include anti-reflective materials (e.g., a backside anti-reflective coating (BARC) layer) to aid processing exposure and focus for imaging top photoresist layer 38. By having middle layer 36, thin top photoresist layer 38 is only used to pattern the middle layer 36. Bottom layer 34 may include a hard mask material, such as, e.g., a nitride (e.g., SiON). In another embodiment, an alternative sequencing of layers may include a hard mask layer over a BARC layer, and a photoresist layer over the hard mask layer.

Middle layer 36 is used to pattern bottom layer 34. In some embodiments, middle layer 36 has a relative high etch selectivity to bottom layer 34, and in some embodiments, bottom layer 34 may be more than ten times thicker than middle layer 36. Thus, tri-layer photoresist 40 allows for robust patterning of underlying layers (e.g., mandrel layer 32) while still providing a relatively thin top photoresist layer 38.

Top photoresist layer 38 may be patterned using any suitable photolithography technique. For example, a photomask (not shown) may be disposed over top photoresist layer 38, which may then be exposed to an electromagnetic radiation beam (e.g., ultraviolet (UV) or an excimer laser, such as, e.g., a 248 nm beam from a Krypton Fluoride (KrF) excimer laser, or a 193 nm beam from an Argon Fluoride (ArF) excimer laser). Exposure of top photoresist layer 38 may be performed using an immersion lithography system to increase resolution and decrease minimum-achievable pitch. A bake or cure operation may be performed to harden top photoresist layer 38, and a developer may be used to remove either exposed or unexposed portions of top photoresist layer 38 (depending on whether a positive or negative resist is used). Thus, a pattern, such as, e.g., the pattern representatively illustrated in FIGS. 1A and 1B, may be formed in top photoresist layer 38, including two openings in top photoresist layer 38, with each opening having a width W1. The two openings are separated by a width W2. Widths W1, W2, and widths in subsequent Figures, are described in terms of desired spacing or width of pattern to be applied to semiconductor device layer 22 (see, e.g., FIG. 9). In an embodiment, width W1 is about five times the desired spacing, and width W2 is about three times the desired spacing. In a representative embodiment, the desired spacing and width value may be about 16 nm. In this example, the resulting pitch would be 32 nm (see, e.g., FIGS. 8A and 8B), width W1 would be about 80 nm, and width W2 would be about 48 nm.

Figure 8A:
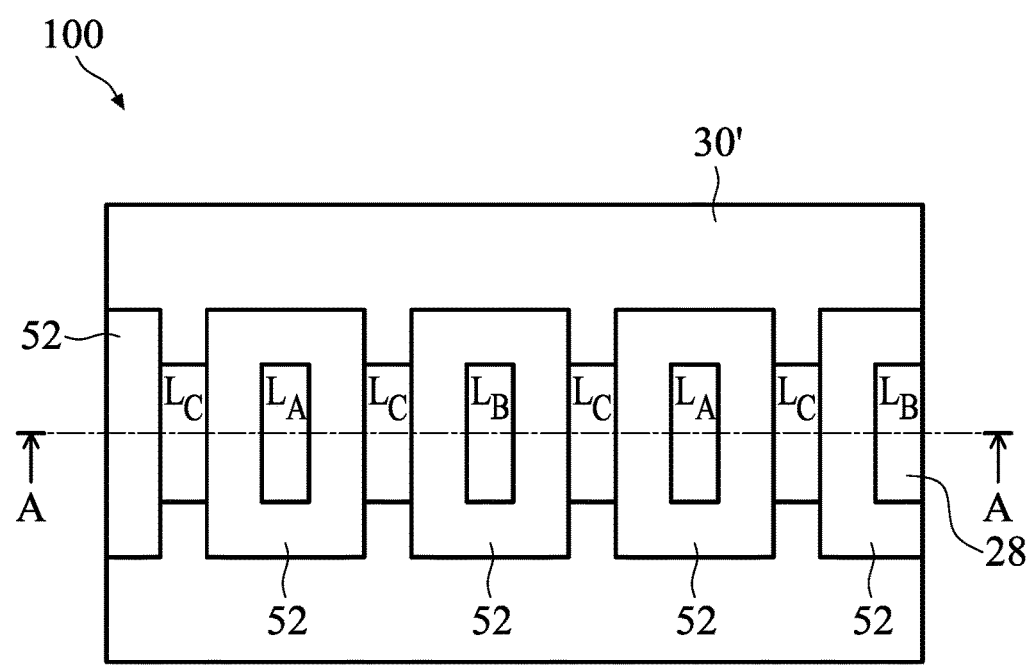
Figure 8B:
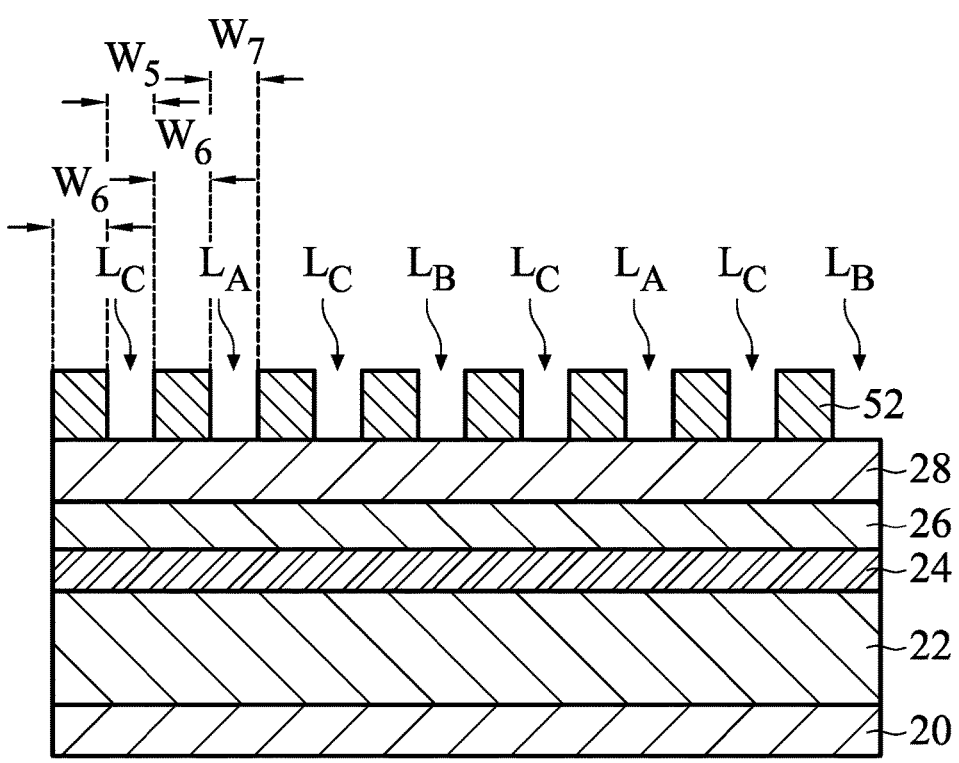

FIGS. 1A and 1B illustrate two openings in photoresist 38, although there may be more or fewer openings depending on a number of spacers 52 desired (see, e.g., FIG. 8B). In addition, although width and spacing in FIGS. 8A and 8B are substantially equal, there may be other alternative, conjunctive, or sequential embodiments where width and spacing of spacers 52 are not equal.

Figure 2A:
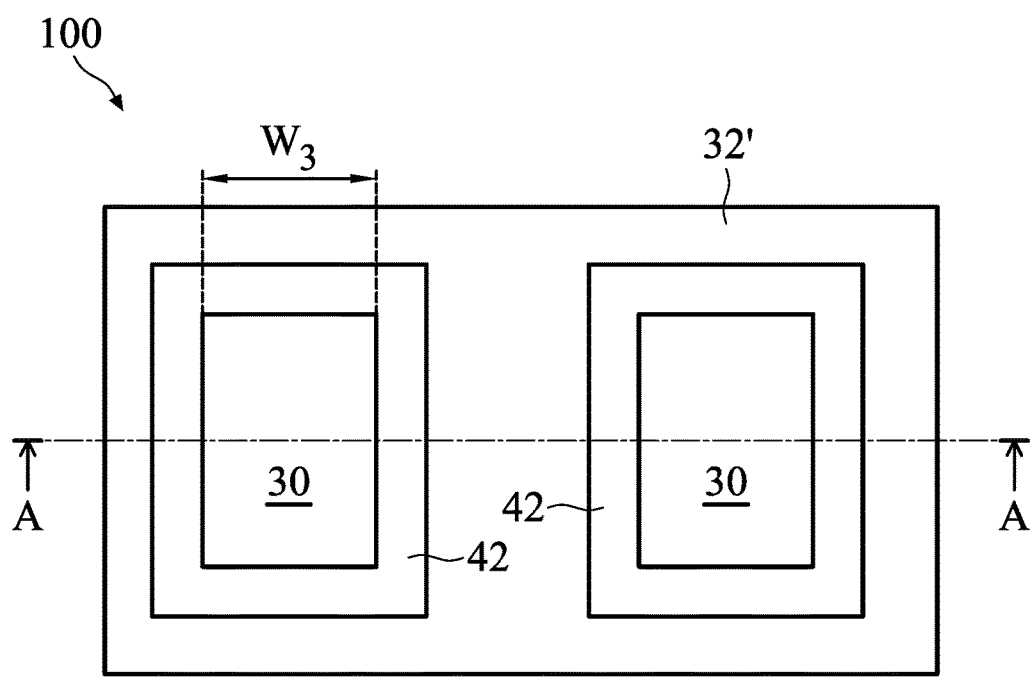
Figure 2B:
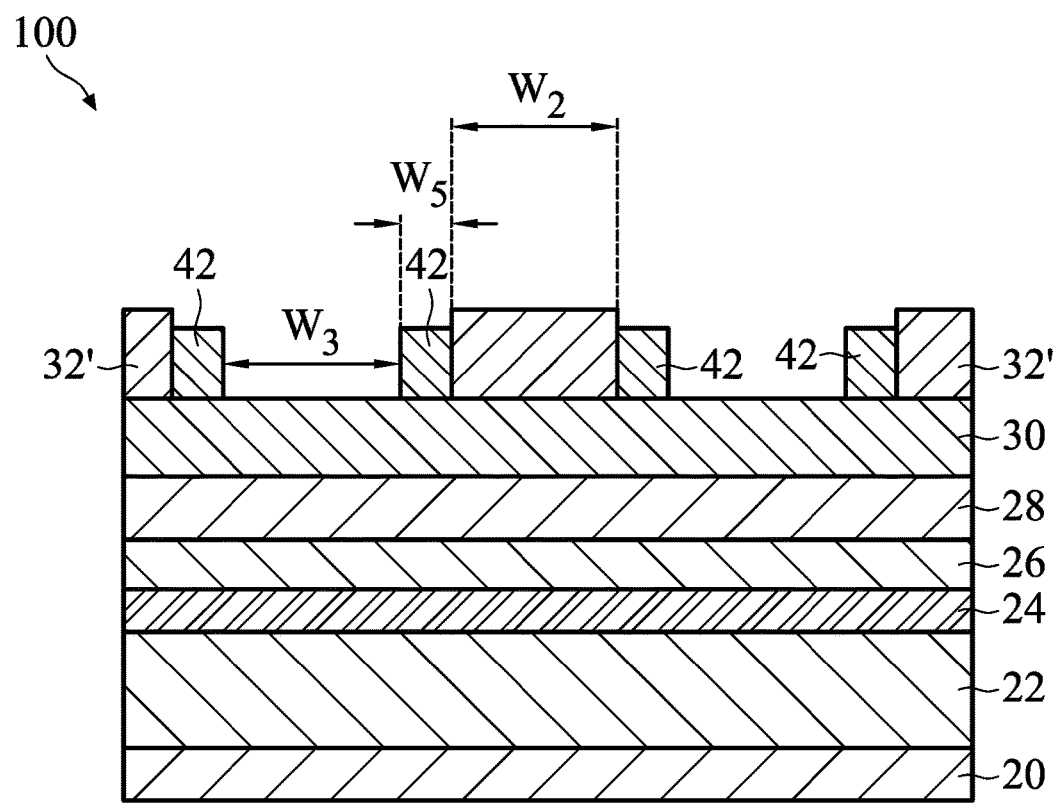

FIGS. 2A and 2B illustrate a resulting structure after mandrel layer 32 has been patterned to form openings and remaining mandrel portions 32'. After developing and patterning top photoresist layer 38, the pattern is transferred to middle and bottom layers 36 and 34, respectively. The pattern may be transferred, for example, by one or more selective etching processes. After selective etching, top photoresist layer 38 and middle layer 36 may be removed, for example, by a trimming process (e.g., an anisotropic plasma etch process). In some embodiments, portions of bottom layer 34 are also removed during the trimming process to achieve a more stable aspect ratio for subsequent etching steps. In a representative embodiment, mandrel layer 32 is etched using bottom layer 34 as a patterning mask to form mandrels 32'. In such an embodiment, remaining portions of bottom layer 34 are removed, for example, with a wet clean process.

In another embodiment, the trimming process may be omitted, and mandrel layer 32 is patterned using layers 38, 36, and 34 of tri-layer photoresist 40 to form remaining mandrel portions 30'. In some embodiments, mandrel layer 32 is patterned by a dry etch process with etch process gases including $O_2$, $CO_2$, $C_xH_yF_z$, Ar, $N_2$, $H_2$, the like, or a combination thereof. As representatively illustrated in FIGS. 2A and 2B, mandrels 32' are formed to have width W2.

After mandrels 32' are formed, a spacer layer (not shown) is formed over mandrels 32' and mandrel layer 30. In an embodiment, the spacer layer is conformally deposited over mandrels 32' and mandrel layer 30 such that the thickness of the spacer layer on a top surface of the mandrel layer 30 and sidewalls of mandrels 32' is substantially a same thickness. In some embodiments, the spacer layer comprises a metal-containing spacer layer, and is made of, titanium nitride, titanium oxide, the like, or a combination thereof. The material of the spacer layer is selected to have a relative high etch selectivity to mandrel layer 30 so that subsequent etching steps may be performed on the spacer layer without attacking mandrel layer 30. The spacer layer may be deposited through a process, such as, e.g., ALD, CVD, PVD, the like, or a combination thereof, although any acceptable process may be utilized to form the spacer layer to a thickness from about 500 Angstroms to about 250 Angstroms. Additionally, a thickness of the spacer layer may be selected to determine a thickness of features eventually formed in semiconductor device layer 22.

After the spacer layer is formed over mandrels 32', the spacer layer may be etched to expose mandrels 32' and form spacers 42. In an embodiment, spacers 42 may comprise titanium oxide. In another embodiment, spacers 42 are titanium nitride. The top portions of the spacer layer may be anisotropically etched to expose underlying mandrels 32' and mandrel layer 30 to form spacers 42. Spacers 42 are formed along sidewalls of mandrels 32' in openings of mandrel layer 32. In an embodiment, etchant used to etch top portions of the spacer layer may comprise $Cl_2$, $O_2$, $C_xH_yF_z$, $N_2$, $H_2$ the like, a combination thereof, or any etchant suitably configured to remove top surfaces of the spacer layer. In an embodiment, spacers 42 are formed to have a width W5 on the order of desired pitch, and width W3 between adjacent spacers 42 on the order of about three times desired pitch. In some embodiments, widths W2 and W3 may be substantially equal.

Figure 3A:
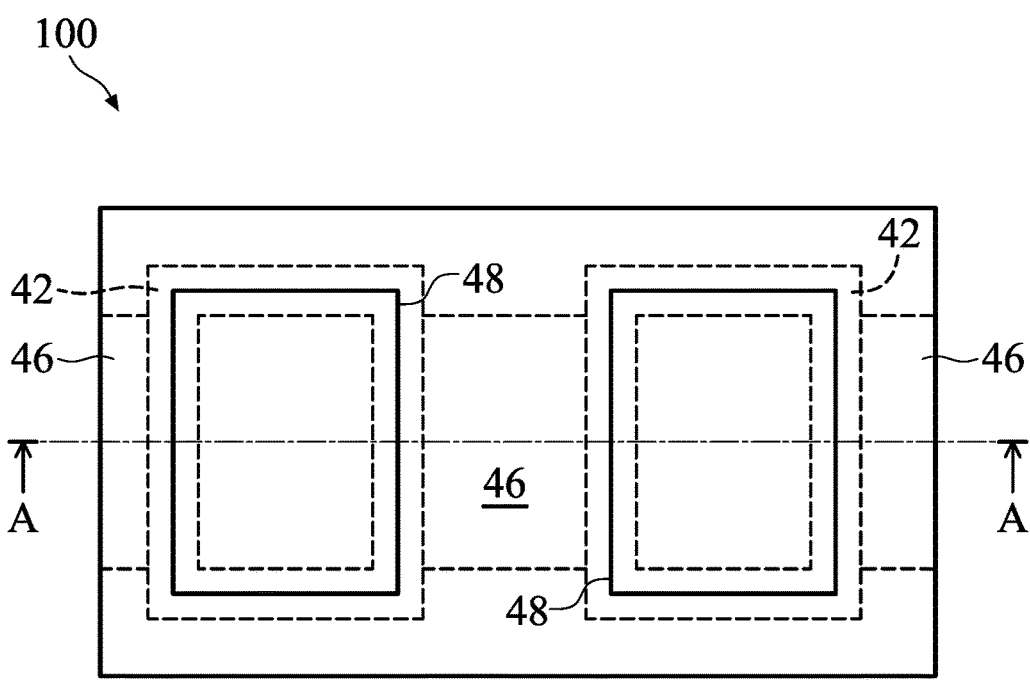
Figure 3B:
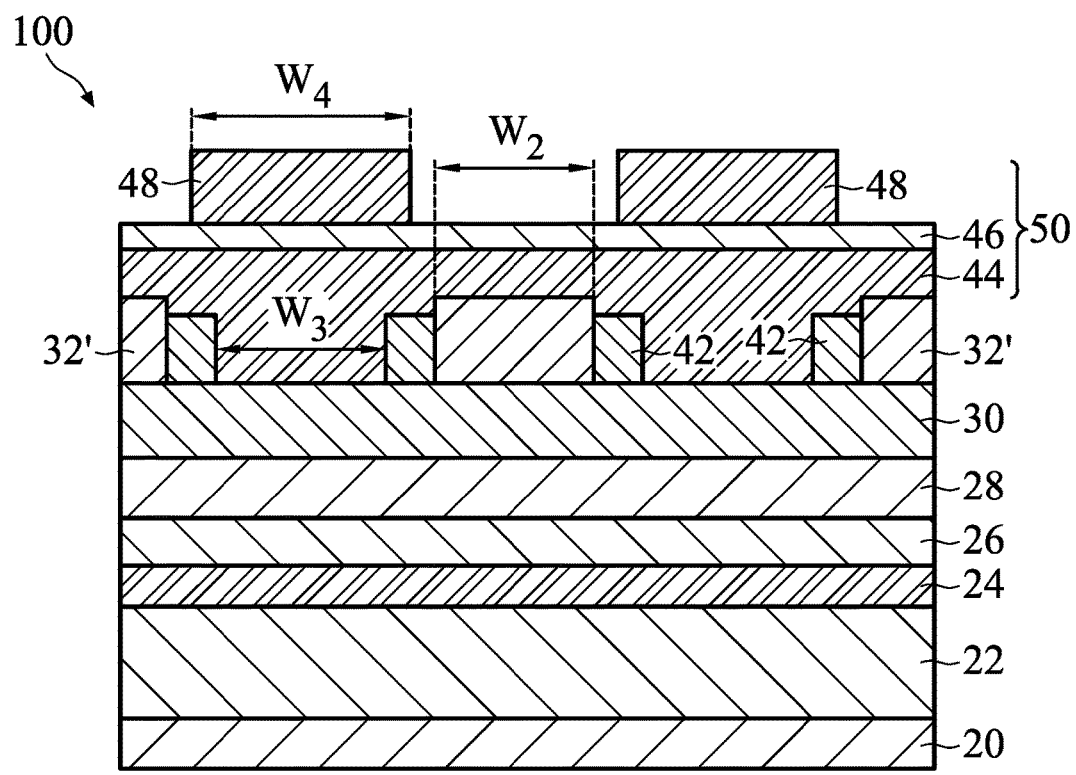

After spacers 42 are formed, tri-layer photoresist 50 is formed over spacers 42 and mandrels 32', as representatively illustrated in FIGS. 3A and 3B. Tri-layer photoresist 50 may be substantially similar to tri-layer photoresist 40, and may include a relatively thin top photoresist layer 48, a middle layer 46 (e.g., a BARC), and a bottom layer 44 (e.g., a hard mask material).

Top photoresist layer 48 may be patterned, for example, by using an immersion photolithography system including a radiation beam (e.g., a 248 nm beam from a KrF excimer laser, or a 193 nm beam from an ArF excimer laser) to expose portions of top photoresist layer 48 and develop exposed/unexposed portions (depending on whether a positive/negative photoresist is used). Thus, a pattern, such as, e.g., the pattern representatively illustrated in FIGS. 3A and 3B, may be formed in top photoresist layer 48, including the three openings in top photoresist layer 48, with the openings being separated by a portion of top photoresist layer 48 having a width W4. In a representative embodiment, width W4 is from about three to about five times desired pitch, such as, e.g., about four times desired pitch. The pattern of top photoresist layer 48 is used to mask portions of mandrel layer 30 exposed between spacers 42 so that upper-lying mandrels 32' may be removed by a subsequent etch process. Thus, width W4 should be greater than or equal to width W3 of the exposed portion of mandrel layer 30, and width W4 should be less than width W3 plus the widths of spacers 42 surrounding the exposed portion of mandrel layer 30. In some embodiments, openings formed in top photoresist layer 48 also have a width W4. The pattern representatively shown in FIGS. 3A and 3B is for illustrative purposes only, and different patterns may be formed depending on a particular design of semiconductor device 100.

Figure 4A:
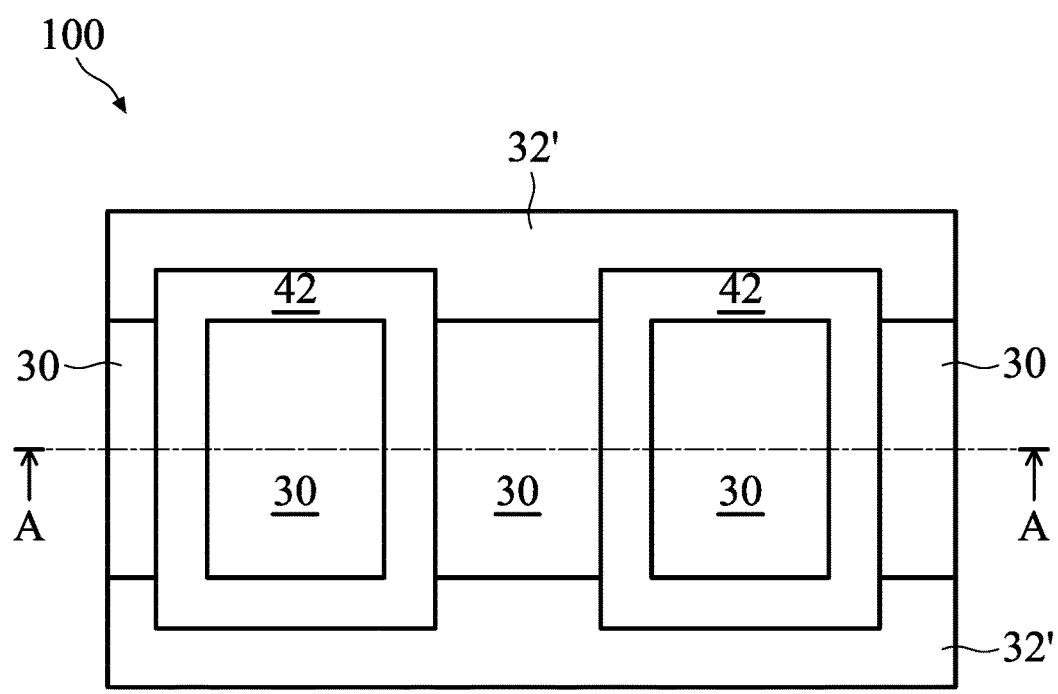
Figure 4B:
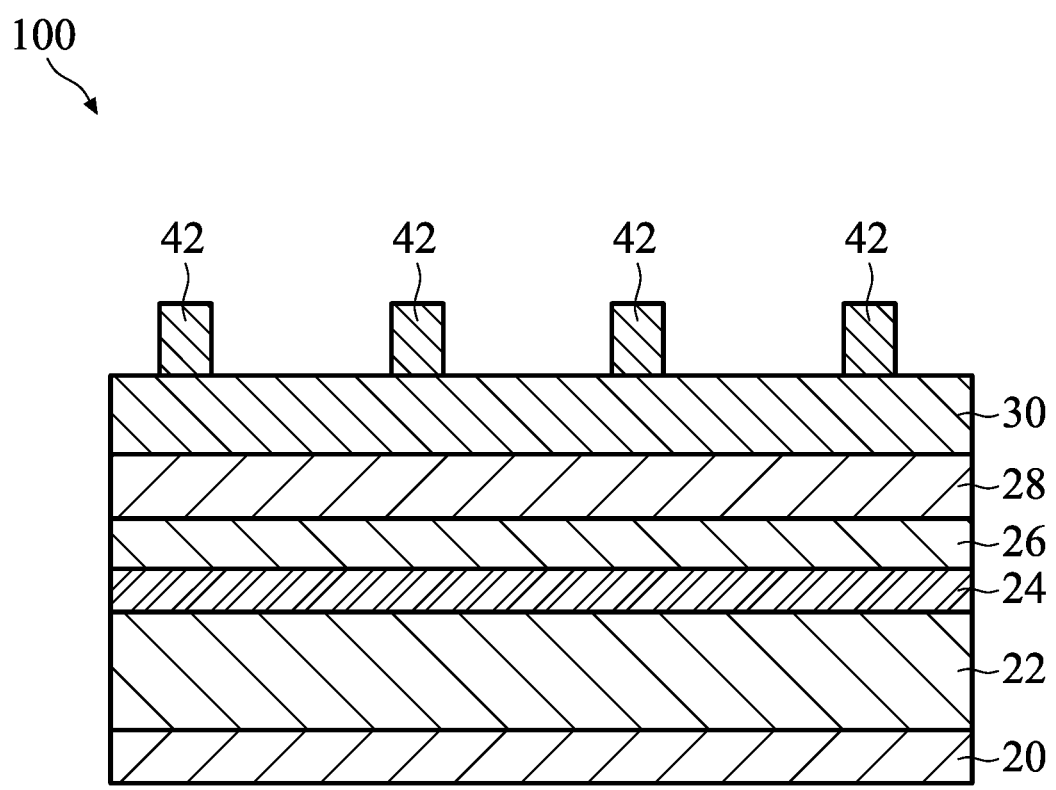

FIGS. 4A and 4B representatively illustrate removal of upper-lying mandrels 32' exposed in openings of top photoresist layer 48 (see, e.g., FIGS. 3A and 3B). Middle layer 46 and bottom layer 44 of tri-layer photoresist 50 are patterned by top photoresist layer 48, such that top surfaces of mandrels 32' are exposed. In an embodiment, exposed mandrels 32' are patterned by a dry etch process with etch process gases including $O_2$, $CO_2$, $C_xH_yF_z$, Ar, $N_2$, $H_2$, the like, a combination thereof, or any other etchant suitably configured to remove mandrels 32' without damaging spacers 42.

Figure 5A:
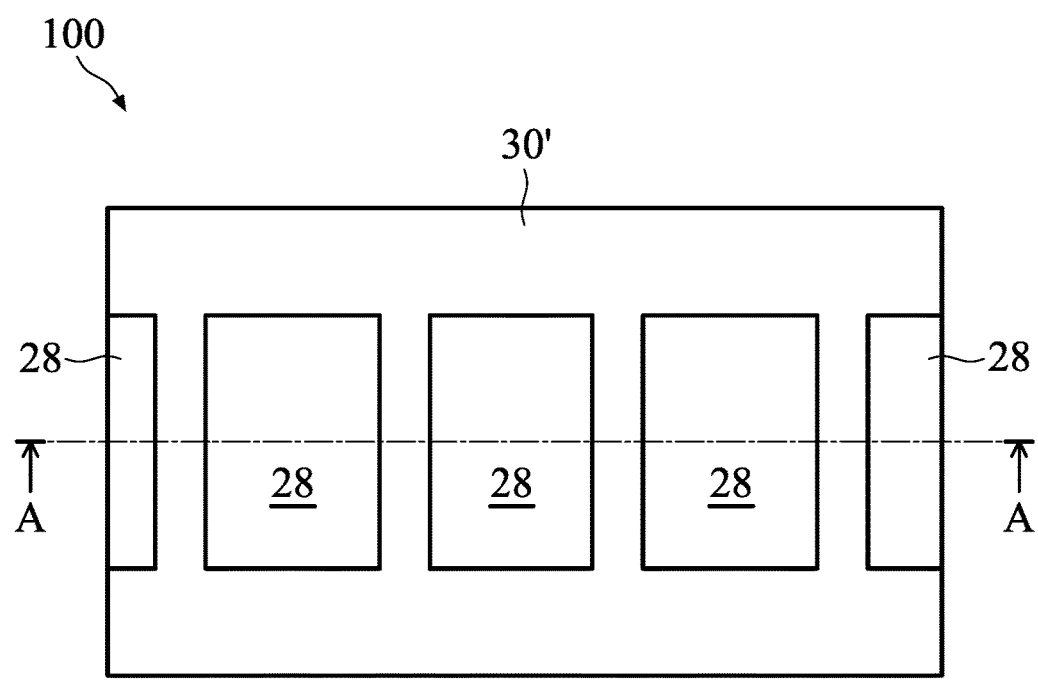
Figure 5B:
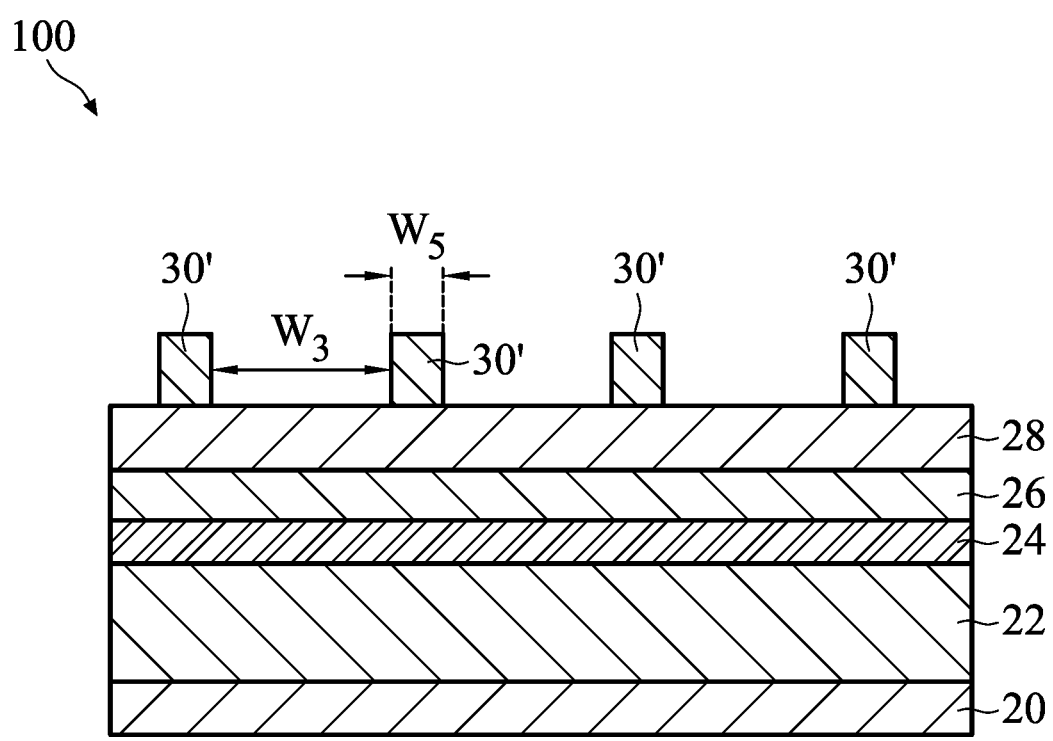

FIGS. 5A and 5B representatively illustrate patterning mandrel layer 30 with spacers 42 to form mandrels 30'. In some embodiments, mandrel layer 30 is patterned with a dry etch process using etch process gases including $O_2$, $CO_2$, $C_xH_yF_z$, Ar, $N_2$, $H_2$, the like, or a combination thereof. As illustrated in FIGS. 5A and 5B, mandrels 30' are formed to have width W5, and adjacent mandrels 30' are separated by width W3. In cases where mandrel layer 30 comprises amorphous silicon, and $CO_2$, $C_xH_yF$ or $N_2$ are used as dry etch processing gases to form mandrels 30', carbon-containing (resulting from, e.g., $CO_2$ or $C_xH_yF_z$, plasma processing) or nitrogen-containing (resulting from, e.g., $N_2$ plasma processing) silicon residues may be formed on or in surface portions of mandrels 30' or hard mask layer 28. Such residues may be cleaned in accordance with representative embodiments.

In cases where mandrel layer 30 comprises amorphous silicon, and $CO_2$, $C_xH_yF$ or $N_2$ are used as dry etch processing gases to form mandrels 30', carbon-containing (resulting from, e.g., $CO_2$ or $C_xH_yF_z$, plasma processing) or nitrogen-containing (resulting from, e.g., $N_2$ plasma processing) silicon residues may be formed on or in surface portions of mandrels 30' or hard mask layer 28. These residues are generally removed or otherwise cleaned in subsequent processing. Conventional removal/cleaning approaches, however, are not suitable for selective removal or cleaning of residue materials produced from dry etching. Moreover, conventional cleaning systems generally produce polymeric residues, which may hinder reclamation of the cleaning system for subsequent additional use.

In a representative embodiment, one or more hydroxyl-terminated compounds may be used to bind with carbon-containing silicon material ($SiC_x$) or nitrogen-containing silicon material ($SiN_y$), followed by removal of $SiC_x$ or $SiN_y$ with fluoride ions ($F^-$). In a representative aspect, hydroxyl-terminated compounds may be suitably adapted or otherwise configured to bond to silicon or silicon oxide coordination sites (e.g., of mandrel 30). For example, hydroxyl-terminated compounds in accordance with representatively disclosed embodiments may be used as protecting groups or moieties for material that is desired not to be removed, such as, e.g., amorphous silicon (α-Si), silicon oxide ($SiO_z$), or the like. Thus, removal of $SiC_x$ or $SiN_y$ with $F^-$ may proceed in a more selective fashion as compared with conventional approaches, such that a rate of removal of $SiC_x$ or $SiN_y$ is greater than a rate of removal of, e.g., α-Si, $SiO_z$, or the like.

Dissociation of dilute aqueous hydrofluoric acid at concentrations less than about 1 molar is generally described by the following equilibria:

$HF \leftarrow\rightarrow H^+ + F^-$ : $K_a$ of about 6.85E-04

$HF + F^- \leftarrow\rightarrow HF^-_2$ : $K_1$ of about 5.0

... where the rate constant R is given by the following:

$R = A[HF] + B[HF^-_2] + C$

Etching of silicon oxide generally proceeds in accordance with the following:

$SiO_2 + 6HF \leftarrow\rightarrow H_2SiF_6 + 2H_2O$

Because $HF^-_2$ is the etchant species for SiO2, the formation of $HF^-_2$ may be inhibited by decreasing HF dissociation in accordance with LeChatlier's principle. By comparison, in dilute aqueous hydrofluoric acid solutions that include ethanol, HF and $HF^-_2$ predominate; whereas, HF and higher-order poly-homoconjugated species $(HF)_nF^-$ predominate in concentrated HF solutions.

The following table provides proportions of various fluoride species in different hydrofluoric acid solutions:

| [HF] | | | Fraction of total fluoride present as ... | | | |
|---|---|---|---|---|---|---|
| (%) | (M) | pH | [HF] free | [$F^-$] | [$HF^-_2$] | [$H_2F_2$] |
| 0.01 | 5.87E-3 | 2.8 | 0.6916 | 0.284 | 0.0045 | 0.0076 |
| 0.05 | 2.93E-2 | 2.4 | 0.7585 | 0.128 | 0.0112 | 0.0455 |
| 0.1 | 5.87E-2 | 2.2 | 0.7218 | 0.0845 | 0.0142 | 0.0826 |
| 0.5 | 2.94E-1 | 1.9 | 0.5161 | 0.0274 | 0.0164 | 0.2114 |
| $HF \leftarrow\rightarrow H^+ + F^-$ | | | K = 6.85E-4 | | | |
| $HF + F^- \leftarrow\rightarrow HF^-_2$ | | | K = 3.963 | | | |
| $2HF \leftarrow\rightarrow H_2F_2$ | | | K = 2.7. | | | |

In a representative aspect, oxide etching of a hydroxyl-terminated silicon site may proceed in accordance with $HF^-_2$ ion coordinating via hydrogen bonding to the silicon site's hydroxyl moiety. Thereafter, a dehydration reaction leaves a fluorine atom in place of the hydroxyl moiety displaced in dehydration, and a fluorine ion in solution.

In another representative aspect, oxide etching of a hydroxyl-terminated silicon site may proceed in accordance with $H_2F_2$ coordinating via hydrogen bonding to the silicon site's hydroxyl moiety. Thereafter, a dehydration reaction leaves a fluorine atom in place of the hydroxyl moiety displaced in dehydration, and hydrofluoric acid (HF) in solution.

In a representative embodiment, fluoride ion attacks the Si—OC bond (e.g., at the surface of an amorphous silicon feature; e.g., mandrel layer 30) to form $H_2SiF_6$, which is subsequently removed with water. The solvent's hydroxyl group (—OH) protects the Si—OH bond on the TEOS surface.

In accordance with various aspects, representative hydroxyl-terminated compounds may include one or more of: an alcohol, a diol, an aldehyde, a carboxylic acid, alcohols, diols, aldehydes, carboxylic acids, 1-(2-hydroxyethyl)-2-pyrrolidone, 2-(hydroxymethoxy)ethanol, ethylene glycol, propylene glycol, diethylene glycol, combinations thereof, or the like. A representative combination may include 1-(2-hydroxyethyl)-2-pyrrolidone and 2-(hydroxymethoxy)ethanol. Another representative combination may include 1-(2-hydroxyethyl)-2-pyrrolidone and diethylene glycol. Another representative combination may include 2-(hydroxymethoxy)ethanol and diethylene glycol. In another embodiment, a hydroxyl-terminated compound may contribute to a representative wet clean system as a diol component, a hydroxyl-terminated component, or both a hydroxyl-terminated component and a diol component (e.g., diethylene glycol). In some embodiments, a diol component of a wet clean system may also function as a hydroxyl-terminated compound of a wet clean system, or a hydroxyl-terminated compound may also function as a diol component of a wet clean system.

In accordance with other representative aspects, fluoride ion donor material may include one or more of AF and $AHF_2$, where 'A' represents an ammonia, amine, or other cations, and where the fluoride ion donor material is configured to establish the following equilibria:

$AF \leftarrow\rightarrow A^+ + F^-$ $AHF_2 \leftarrow\rightarrow HF + A^+ + HF^-_2$ Relative dissociation rates producing $F^-$ and $HF^-_2$ may be altered by modifying pH of the cleaning system. Thus, an affinity for removing or otherwise cleaning carbon-containing or nitrogen-containing silicon residues may be tuned to minimize removal of, e.g., amorphous silicon, silicon oxide, or the like. For example, a representative semi-aqueous cleaning system may have a pH between about 4.5 and about 5.5 (e.g., the fluoride ratio may be buffered with monoethanolamine (MEA) at a pH of about 5.3 with a cleaning time of between about 60 seconds and about 600 seconds at a temperature of between about 30° C. and about 70° C.). The following is a proposed mechanism for buffering with MEA:

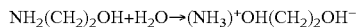

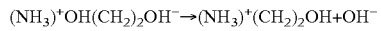

Table 1 provides data for representative semi-aqueous cleaning systems employing varied water ratios. The cleaning system samples included between about 5% weight/weight (wt/wt) to about 30% (wt/wt) of a hydroxyl-terminated compound (e.g., 1-(2-hydroxyethyl)-2-pyrrolidone), between about 2% (wt/wt) to about 15% (wt/wt) of a diol compound (e.g., diethylene glycol), about 0.2% (wt/wt) to about 0.5% (wt/wt) fluoride ion donor material (e.g. as a combination of ammonium fluoride and ammonium bifluoride), and between about 25% (wt/wt) to about 60% (wt/wt) water. In a representative embodiment, a ratio (wt/wt) of ammonium fluoride to ammonium bifluoride is between about 0.5 and about 10.

TABLE 1

| water ratio (wt %) | post-dry-etch α-Si removal rate (Å/min) @ 50° C. | post-dry-etch TEOS removal rate (Å/min) @ 50° C. | selectivity (α-Si/ TEOS) @ 50° C. | α-Si critical dimension loss | TEOS recession |
|---|---|---|---|---|---|
| 25 | 9.75 | 6.9 | 1.41 | 2~3 nm | 1.3~1.8 nm |
| 45 | 6.69 | 4.3 | 1.56 | 1.5~2 nm | 0.1~0.5 nm |
| 40 | 7.11 | 4.5 | 1.58 | 1.4~3 nm | 0.4~0.9 nm |
| 30 | 7.40 | 5.1 | 1.45 | 2~4 nm | 0.5~1.2 nm |
| 50 | 4.52 | 3.1 | 1.46 | 1.1~2.1 nm | |
| 60 | 3.35 | 2.2 | 1.52 | 0.4~0.7 nm | |

Removal rates in Table 1 refer to wet clean removal rates of carbon-containing silicon residues after dry etch processing. As can be seen in Table 1, a selectivity of 1.56 (amorphous silicon/TEOS) was obtained with nominal recession (e.g., 0.1-0.5 nanometers) of TEOS material and minimal critical dimension loss (e.g., 1.5-2 nanometers) of amorphous silicon with a water ratio of about 45%.

The following elemental abundance data corresponds to X-ray photoelectron spectroscopy (XPS) analysis of an amorphous silicon material subjected to a carbon-containing plasma etch, and subsequently cleaned with a semi-aqueous cleaning system in accordance with a representative embodiment: 1.3% carbon (C), 62.8% oxygen (O), 0.4% fluorine (F), and 35.5% silicon (Si). After dry etch, but before cleaning with the semi-aqueous cleaning system, XPS analysis of the amorphous silicon material gave: 8.2% C, 59.6% O, 1.2% F, and 31.0% Si. Accordingly, the semi-aqueous cleaning system reduced the amount of carbon by a factor of about 6.3.

The following elemental abundance data corresponds to XPS analysis of a TEOS material subjected to a carbon-containing plasma etch, and subsequently cleaned with a semi-aqueous cleaning system in accordance with a representative embodiment: 1.5% C, 64.9% O, 0.9% F, and 32.7% Si. After dry etch, but before cleaning with the semi-aqueous cleaning system, XPS of the TEOS material gave: 4.7% C, 62.2% O, 1.5% F, and 31.6% Si. Accordingly, the semi-aqueous cleaning system reduced the amount of carbon by a factor of about 3.1.

For an amorphous silicon mandrel formed by PVD over a TEOS layer, where the mandrel was dry etched with a carbon-containing plasma and subsequently cleaned for a duration of about 240 seconds with a semi-aqueous cleaning system in accordance with a representative embodiment, TEOS recession/loss was measured at about 2.66 nm. Accordingly, various representative aspects may include the ability to achieve a positive TEOS recession/loss of less than about 3 nm. Additionally, wafer-level critical dimension uniformity was improved by a factor of about 8.

In a representative aspect, aqueous or semi-aqueous wet clean systems disclosed herein may be suitably configured or otherwise adapted to provide appropriate conditions for controlling or otherwise modifying chemical stability. For example, in a representative embodiment, a buffer (e.g., MEA) may be employed to set or limit shifting away from a desired pH. In another representative aspect, aqueous or semi-aqueous systems disclosed herein provide improvements in terms of wetting or solubility characteristics. In yet other representative aspects, systems and methods generally disclosed herein provide for improved reclamation of a wet clean system for subsequent use. In still other representative aspects, systems and methods generally disclosed herein may be employed to improve a processing window for semiconductor device manufacture. Wet clean systems and methods for removal of carbon-containing or nitrogen-containing silicon residues, as representatively disclosed herein, may be used with any desired pitch for a semiconductor device manufacturing process (e.g., at 20 nm, 16 nm, to nm, 7 nm, 5 nm, sub-5 nm, or the like).

Figure 6A:
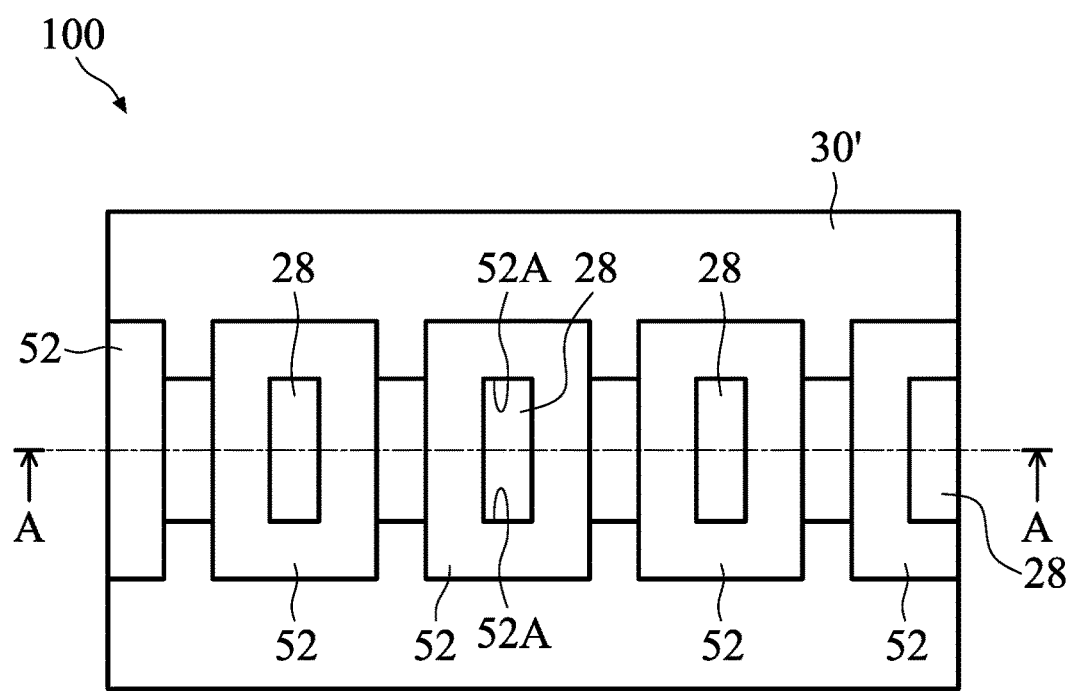
Figure 6B:
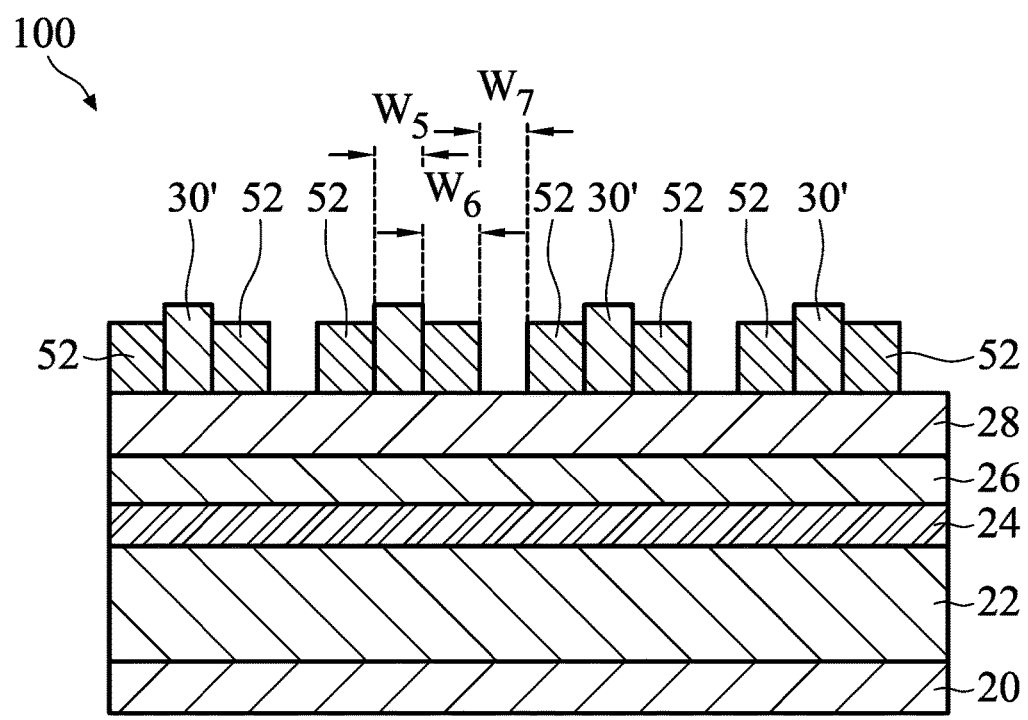

FIGS. 6A and 6B representatively illustrate formation of spacers 52 along sidewalls of mandrels 30'. In an embodiment, spacers 52 may comprise titanium oxide. In another embodiment, spacers 52 are titanium nitride. After mandrels 30' are formed, a spacer layer (not shown) is formed over mandrels 30' and hard mask layer 28. The spacer layer is similar to the spacer layer previously described, although alternative spacer layers need not be the same or similar. Thickness of the spacer layer may be selected to determine the thickness of features eventually formed in semiconductor device layer 22.

After the spacer layer is formed over mandrels 30', the spacer layer may be etched to expose mandrels 30' and form spacers 52. The spacer layer may be etched by a similar process to the spacer layer etch previously described, although the spacer layer etch processes need not be the same or similar. In an embodiment, spacers 52 are formed to have a width W6. In an embodiment, width W6 is on the order of desired pitch, and width W7 between adjacent spacers 52 is also on the order of desired pitch. In some embodiments, widths W5, W6, and W7 may be substantially equal.

By forming a second set of spacers 52 on sidewalls of the pattern of the first set of spacers 42 (used to form mandrels 30'), quadruple patterning is achieved to reduce pitch. For example, a representative process can be adapted to use 128 nm pitch lithography and two 16 nm thick spacer layers to achieve a 32 nm pitch interconnect. Thus, the disclosed process can utilize 193 nm immersion lithography to achieve 32 nm pitch while also having a lower cost and higher throughput than newer lithography methods, such as, e.g., extreme ultraviolet (EUV) lithography, or the like.

Figure 7A:
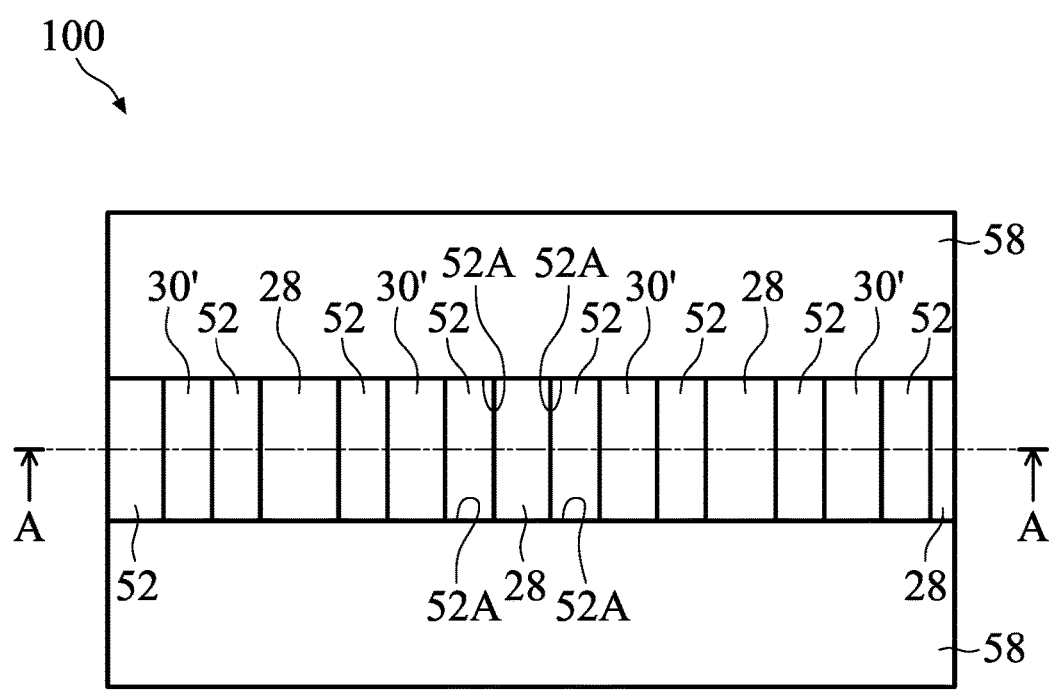

FIG. 7A (where bottom layer 54 and middle layer 56 have been removed for clarity of illustration) and 7B illustrate formation of a tri-layer photoresist 60 over spacers 52 and mandrels 30'. The tri-layer photoresist 60 may be substantially similar to tri-layer photoresist 40, and includes a relatively thin top photoresist layer 58, a middle layer 56 (e.g., BARC), and a bottom layer 54 (e.g., hard mask material).

Top photoresist layer 58 may be patterned, for example, by using an immersion photolithography system including an electromagnetic radiation beam (e.g., a 248 nm beam from a KrF excimer laser, or a 193 nm beam from an ArF excimer laser) to expose portions of top photoresist layer 58, and develop exposed or unexposed portions (depending on whether a positive or negative photoresist is used). Thus, a pattern (e.g., the pattern representatively illustrated in FIGS. 7A and 7B) may be formed in top photoresist layer 58, including an opening in a central portion of top photoresist layer 58. In an embodiment, sidewalls of the opening in top photoresist layer 58 may be substantially aligned with sidewalls 52A of spacers 52 (see, e.g., FIGS. 6A and 7A). The pattern of top photoresist layer 58 is used to mask portions of mandrels 30' so that other portions of mandrels 30' may be removed by subsequent etching. The pattern representatively shown in FIGS. 7A and 7B is for illustrative purposes, and different patterns may be formed depending on a particular design of semiconductor device 100.

Figure 7B:
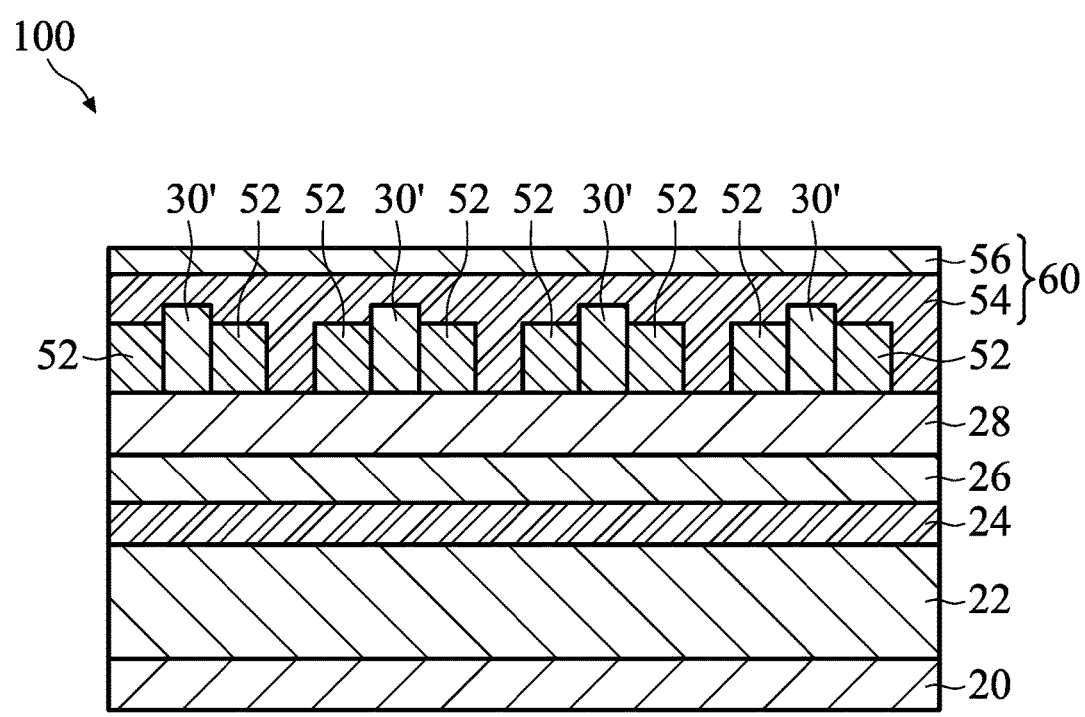

FIGS. 8A and 8B representatively illustrate removal of portions of mandrels 30' exposed in the opening of top photoresist layer 58 (see, e.g., FIGS. 7A and 7B). Middle layer 56 and bottom layer 54 of tri-layer photoresist 60 are patterned by top photoresist layer 58, such that portions of top surfaces of mandrels 30' are exposed. In a representative embodiment, exposed mandrels 30' are patterned by a dry etch process with etch process gases including $O_2$, $CO_2$, $C_xH_yF_z$, Ar, $N_2$, $H_2$, the like, a combination thereof, or any other suitable etchant that can remove mandrels 30' without damaging spacers 52 and hard mask layer 28.

After portions of mandrels 30' are removed, spacers 52 remain on a surface of hard mask layer 28. Spacers 52 each have a width W6 and are spaced apart by widths W5 or W7. In a representative embodiment, widths W5, W6, and W7 may be substantially equal. In a representative aspect, widths W5, W6, and W7 may all be about 16 nm, and thus the pitch of spacers 52 is about 32 nm.

As representatively illustrated in FIGS. 8A and 8B, the pattern defined by spacers 52 comprises a combination of several lithography processes. Line pattern A (LA) results from lithography steps employing tri-layer photoresist 40 and spacers 42, as generally illustrated in FIGS. 1A through 2B. Line pattern B (LB) results from lithography steps employing tri-layer photoresist 50 and spacers 52, as generally illustrated in FIGS. 3A through 4B. Line pattern C (LC) results from lithography steps employing tri-layer photoresist 60 and spacers 52, as generally illustrated in FIGS. 7A through 8B.

Figure 9:
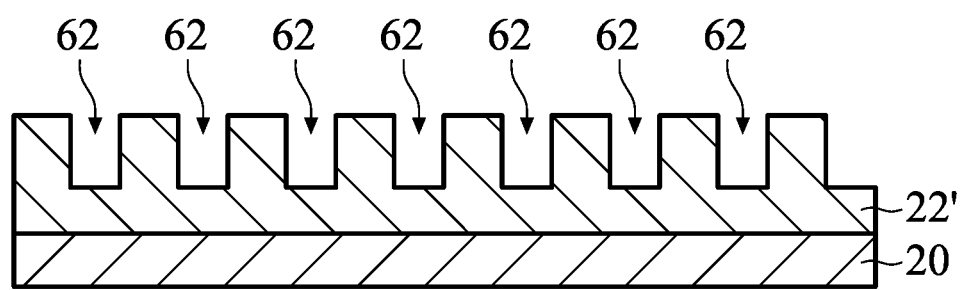

As representatively illustrated in FIG. 9, spacers 52 may be used to pattern hard mask layer 28, hard mask layer 26, ARC layer 24, and semiconductor device layer 22. In a representative embodiment, hard mask layer 28 may be patterned by a dry etch process with etch process gases including $O_2$, $CO_2$, $C_xH_yF_z$, Ar, $N_2$, $H_2$, the like, or a combination thereof, or any other suitable etchant system that can pattern hard mask layer 28. Patterned hard mask layer 28 may then be used as a mask to pattern hard mask layer 26. In a representative embodiment, hard mask layer 26 may be patterned using an etch process including etchant gases comprising $Cl_2$, $O_2$, $C_xH_yF_z$, $N_2$, $H_2$, the like, or a combination thereof.

ARC 24 may be patterned using patterned hard mask layer 28 as a mask. ARC 24 may be patterned by an etch process including etchants, such as, e.g., $C_4F_8$, $N_2$, $O_2$, Ar, the like, or a combination thereof. Patterned hard mask layer 28 may be used to transfer the representatively illustrated pattern to semiconductor device layer 22, for example, through an etching process to form a patterned semiconductor device layer 22'. In an embodiment, an upper portion of the patterned semiconductor device layer 22' has plural trenches 62 formed therein. Spacers 52, hard mask layer 26, and ARC layer 24 may then be removed, as generally shown in FIG. 9. Plural trenches 62 may be filled with a conductive material to form plural conductive lines (see, e.g., FIG. 10).

Figure 10:
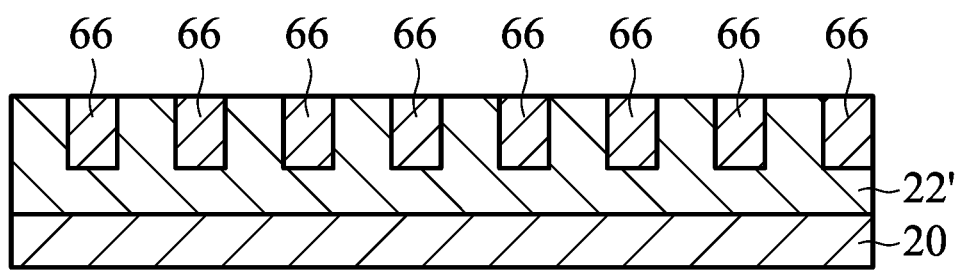

FIG. 10 representatively illustrates forming a conductive material 66 over patterned semiconductor device layer 22', filling plural trenches 62. Conductive material 66 may include, e.g., a barrier layer, a seed layer, a liner, multiple layers, or combinations thereof. A fill material, such as, e.g., copper, a copper alloy, aluminum, an aluminum alloy, the like, or a combination thereof, may be formed over the layers/liner using an electro-chemical plating (ECP) or other deposition method. A chemical-mechanical polish (CMP) process or etch process may be used to remove excess conductive material 66 from over top surfaces of patterned semiconductor device layer 22', as generally illustrated in FIG. 10, thereby forming plural conductive lines 66 in patterned semiconductor device layer 22'. Conductive lines 66 may be configured to have a substantially same pitch and spacing as spacers 52 generally shown in FIGS. 8A and 8B.

By forming two sets of spacers with substantially same widths (e.g., spacers 42 and 52), quadruple patterning is achieved to reduce pitch. For example, a representative process can be suitably configured to use 128 nm pitch lithography with two 16 nm thick spacer layers to achieve a 32 nm pitch interconnect. Thus, representative embodiments can utilize 193 nm immersion lithography to achieve 32 nm pitch while also having a lower cost and higher throughput than newer lithography methods, such as, e.g., extreme ultraviolet (EUV) lithography, or the like.

FIGS. 11A through 15B are cross-sectional views of intermediate stages in patterning of a semiconductor device 200, in accordance with another representative embodiment. The patterning of semiconductor device 200 is similar to the patterning of semiconductor device 100, except that semiconductor device 200 includes another hard mask layer 31 between mandrel layer 30 and mandrel layer 32. The additional hard mask layer 31 allows additional material schemes for hard mask layers, and mandrel layers.

Figure 11A:
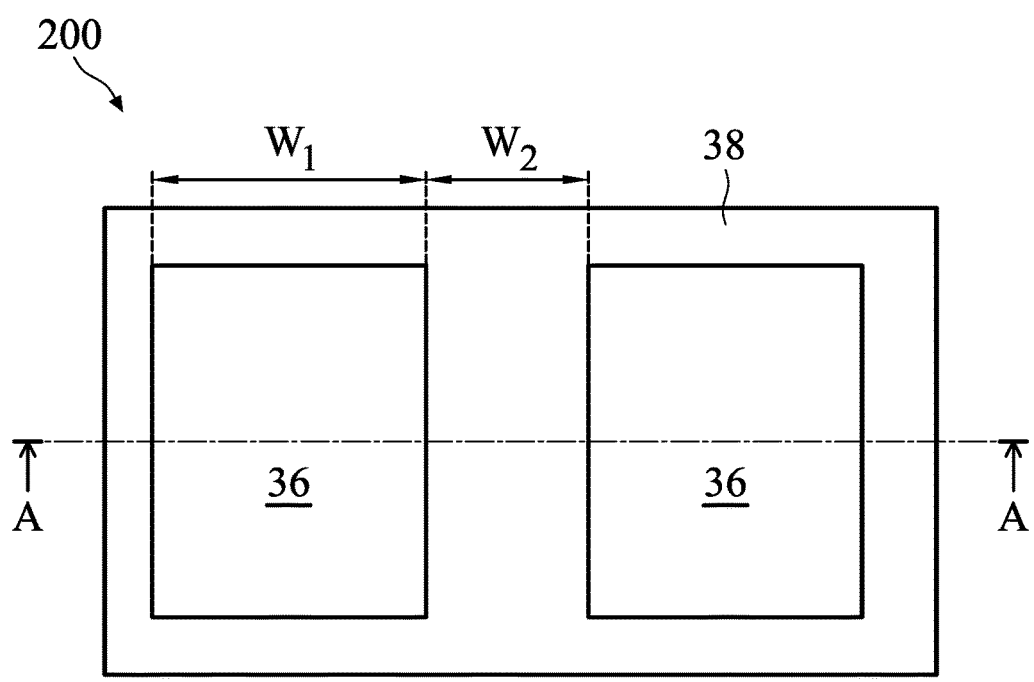
FIGS. 11A, 11B, 12A, 12B, 13A, 13B, 14A, 14B, 15A, and 15B are top-views and cross-sectional views of intermediate stages in the patterning of a semiconductor device in accordance with another embodiment.
Figure 11B:
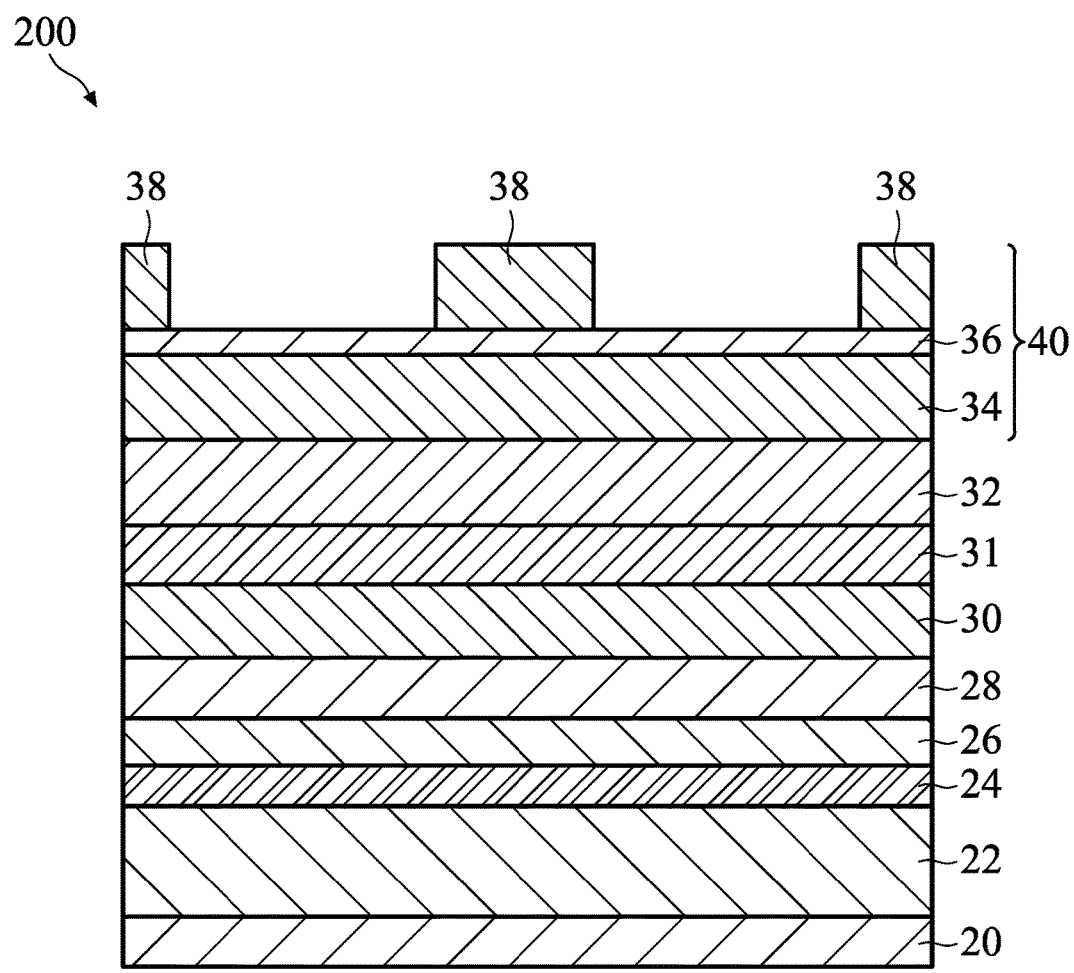

Referring to FIGS. 11A and 11B, hard mask layers 26, 28, and 31, and mandrel layers 30 and 32 are formed over ARC 24. In a representative embodiment, hard mask layer 26 comprises a metal hard mask layer, and hard mask layers 28, 30, 31, and 32 comprise dielectric hard mask layers. In subsequent processing steps, a pattern is transferred onto hard mask layer 26 using various photolithography and etching techniques. Hard mask layer 26 may then be used as a patterning mask for etching underlying ARC 24 and semiconductor device layer 22. Hard mask layer 26 may comprise a masking material, such as, e.g., titanium nitride, titanium oxide, the like, or a combination thereof. Hard mask layer 26 may be formed using a process, such as, e.g., CVD, PVD, ALD, the like, or a combination thereof. In a representative embodiment, hard mask layer 26 may be formed to have a thickness from about 100 Angstroms to about 500 Angstroms.

Hard mask layer 28 may be deposited over hard mask layer 26. Hard mask layer 28 may be used as a masking pattern for hard mask layer 26. In subsequent processing steps, hard mask layer 28 is patterned by multiple patterns, which may then be transferred to hard mask layer 26. Hard mask layer 28 may comprise a masking material, such as, e.g., TEOS, SiO$_x$C$_y$, the like, or a combination thereof. Hard mask layer 28 may be formed using a process, such as, e.g., CVD, ALD, the like, or a combination thereof. In a representative embodiment, hard mask layer 28 may be formed to have a thickness from about 100 Angstroms to about 1000 Angstroms. Mandrel layer 30 is formed over hard mask layer 28. Mandrel layer 30 may be a masking material, such as, e.g., amorphous silicon, a metal film, such as, e.g., AlO$_x$N$_y$, the like, or a combination thereof, or any other material that may be patterned and selectively removed. Mandrel layer 30 may be formed using a process, such as, e.g., CVD, ALD, the like, or a combination thereof. In a representative embodiment, hard mask layer 30 may be formed to have a thickness from about 100 Angstroms to about 1000 Angstroms. Hard mask layer 31 is formed over mandrel layer 30. Hard mask layer 31 may be formed by similar processes and materials as hard mask layer 28 as previously described, although hard mask layers 28 and 31 need not be the same or similar. Mandrel layer 32 is formed over hard mask layer 31. Mandrel layer 32 may be formed by similar processes and materials as mandrel layer 300 as previously described, although mandrel layers 30 and 32 need not be the same or similar.

Figure 12A:
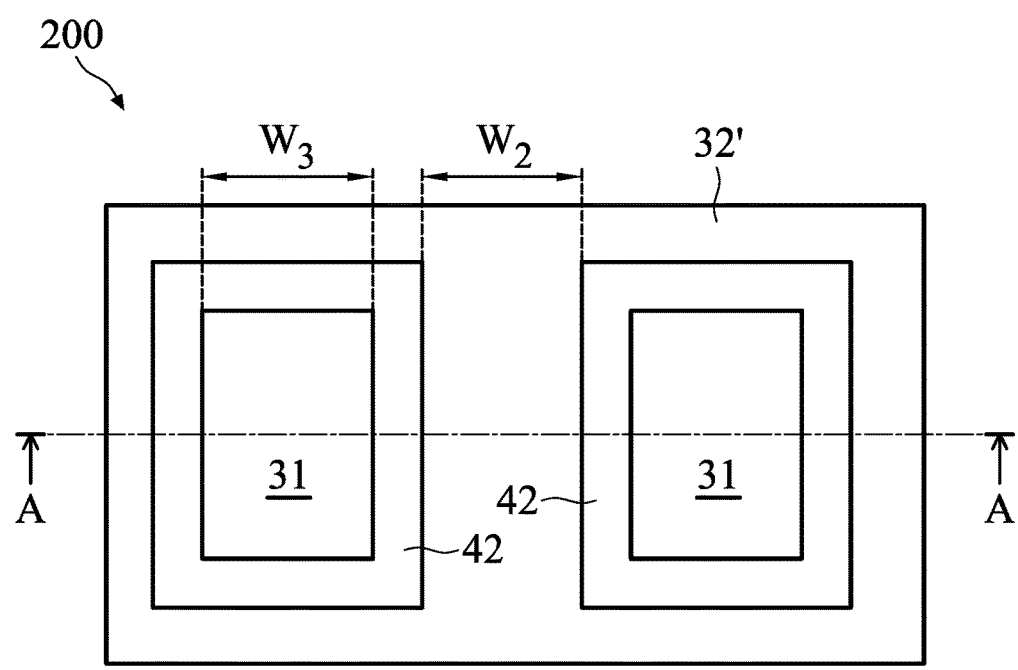
Figure 12B:
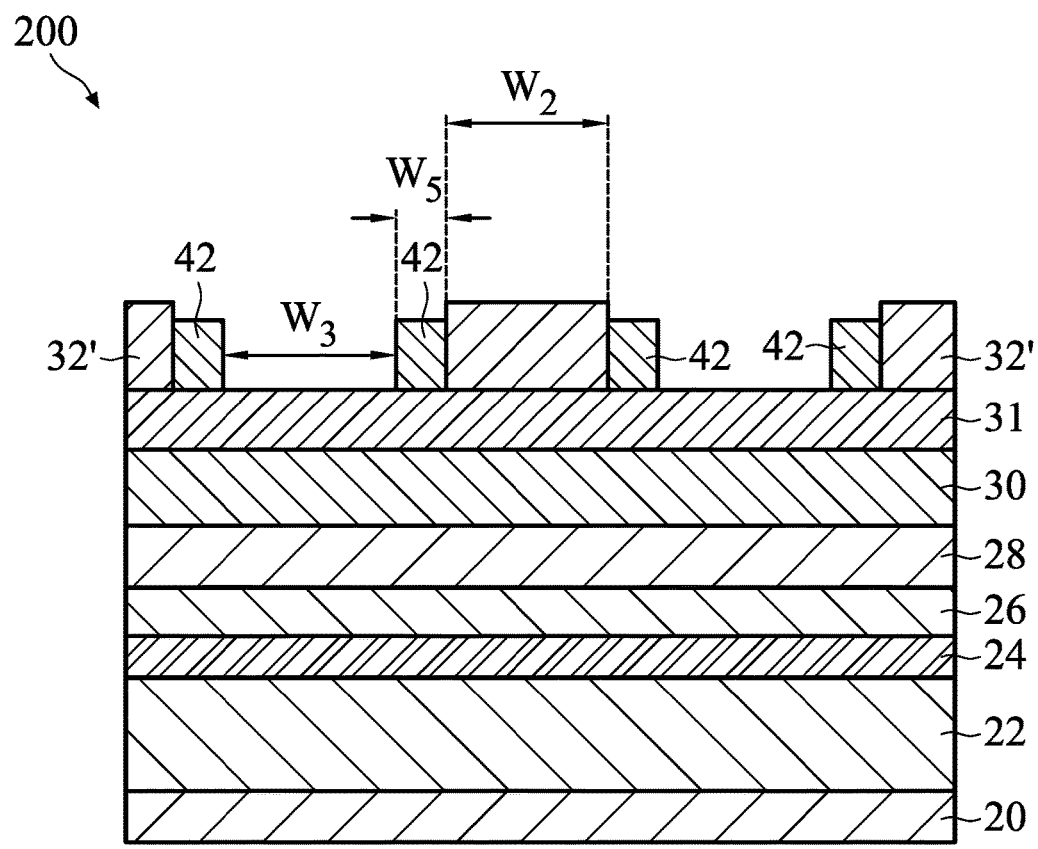

FIGS. 12A and 12B representatively illustrate structure resulting after mandrel layer 32 has been patterned to form openings and mandrels 32' on a surface of hard mask layer 31. The process of forming representatively illustrated structures of FIGS. 12A and 12B is similar to the process described above with respect to FIGS. 2A and 2B, and is not repeated herein for concision of description.

Figure 13A:
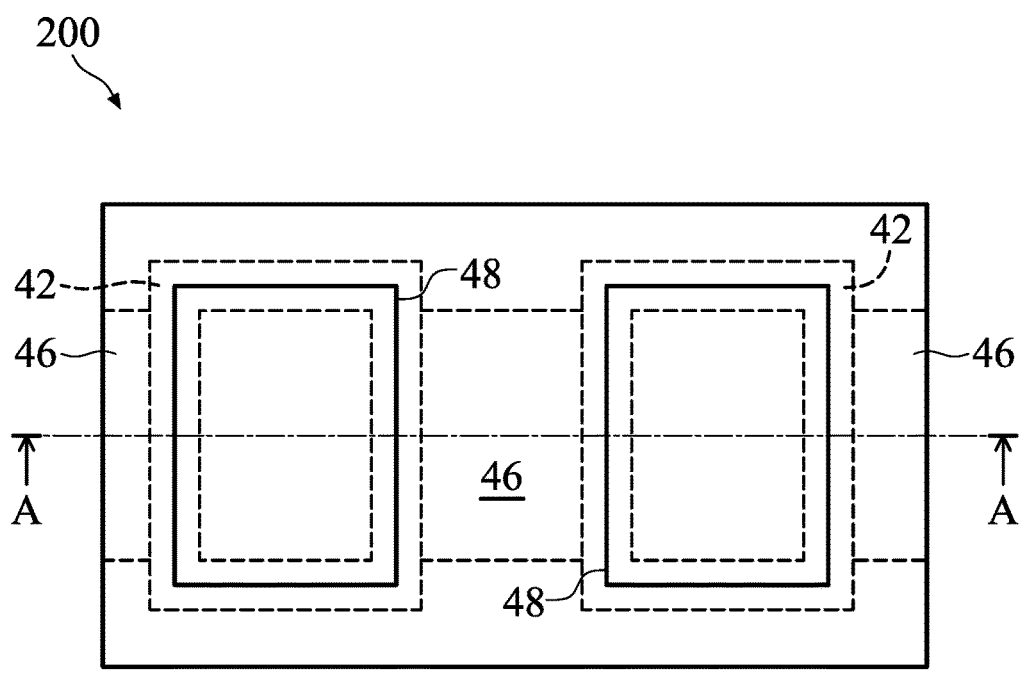
Figure 13B:
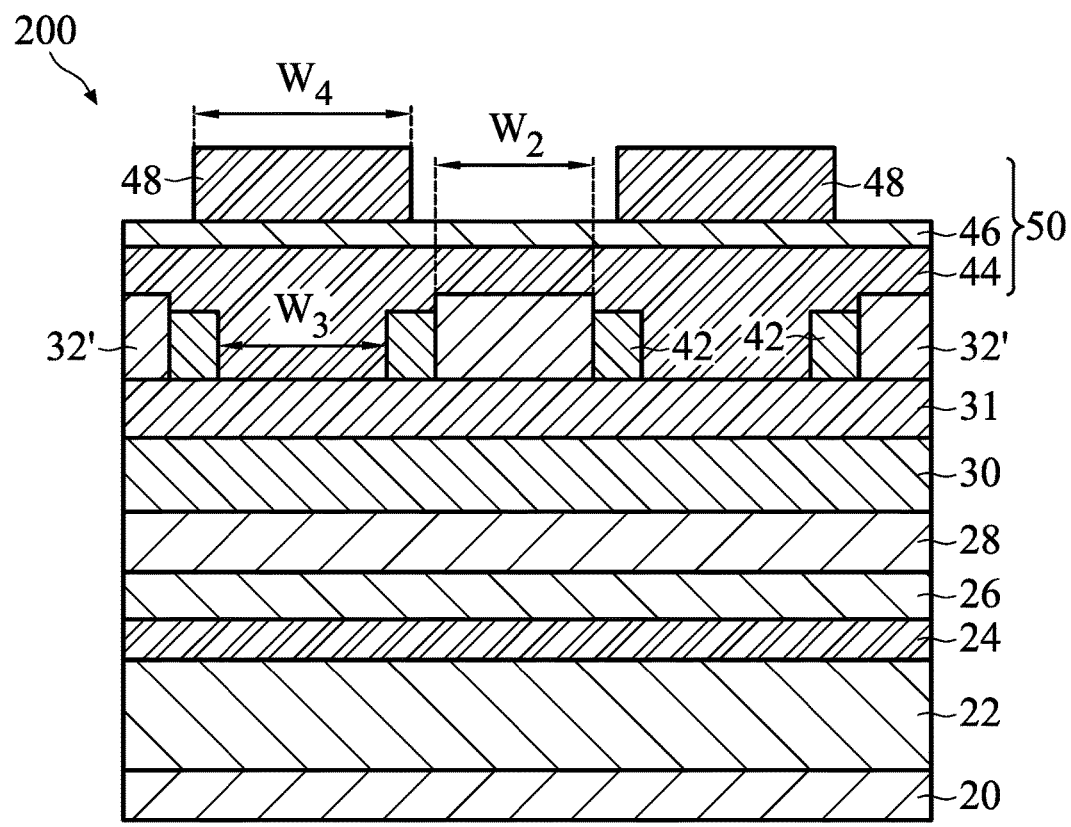

FIGS. 13A and 13B representatively illustrate formation of tri-layer photoresist 50 over mandrels 32' and hard mask layer 31. The process of forming representatively illustrated structures of FIGS. 13A and 13B is similar to the process described above with respect to FIGS. 3A and 3B, and is not repeated herein for concision of description.

Figure 14A:
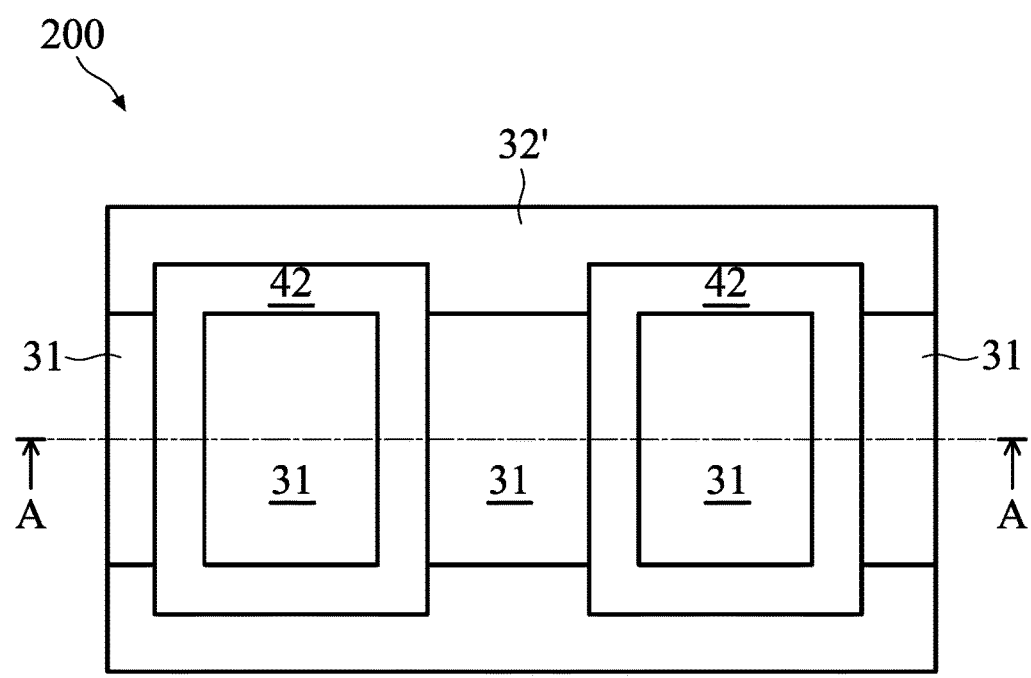
Figure 14B:
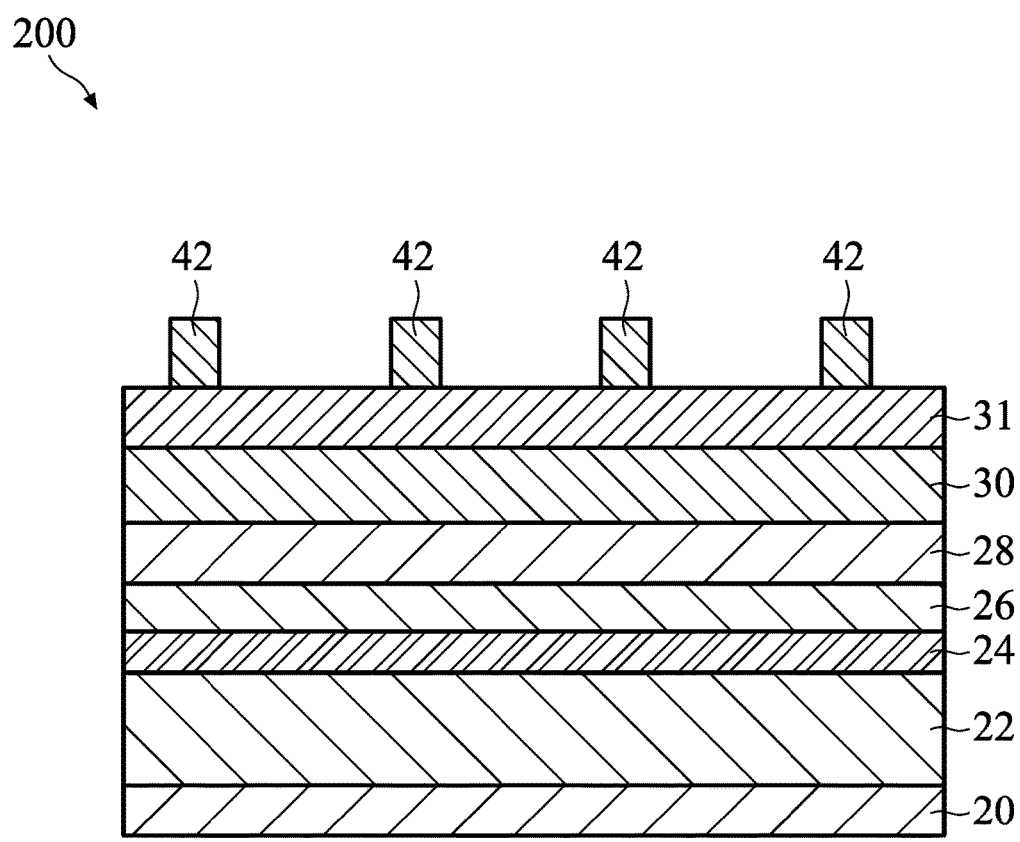

FIGS. 14A and 14B representatively illustrate removal of mandrels 32' exposed in openings of top photoresist layer 48 (see, e.g., FIGS. 13A and 13B). The process of forming representatively illustrated structures of FIGS. 14A and 14B is similar to the process described above with respect to FIGS. 4A and 4B, and is not repeated herein for concision of description.

Figure 15A:
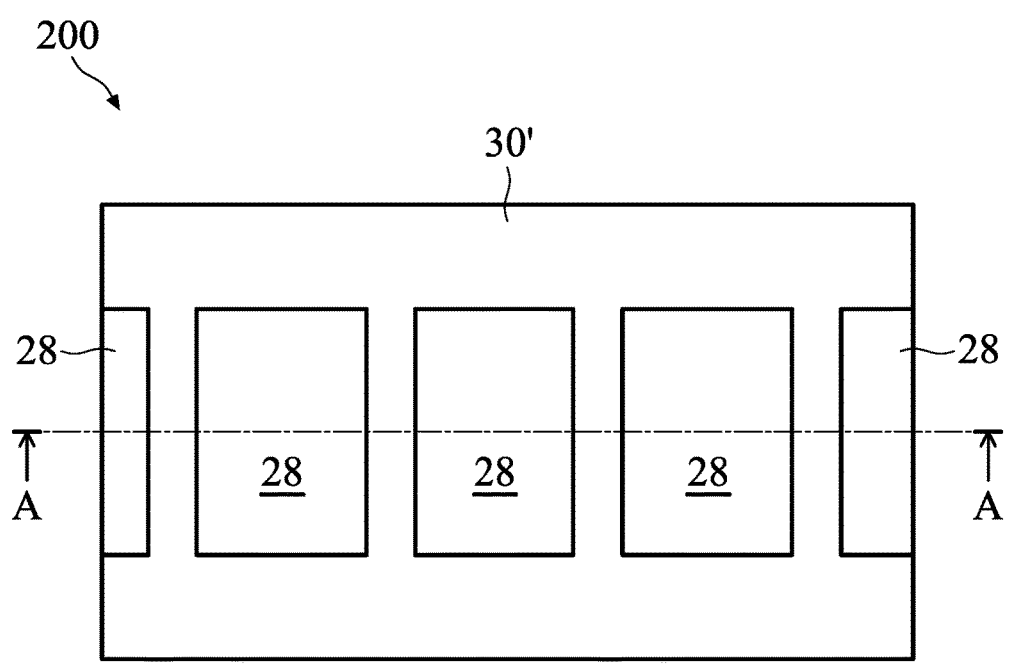
Figure 15B:
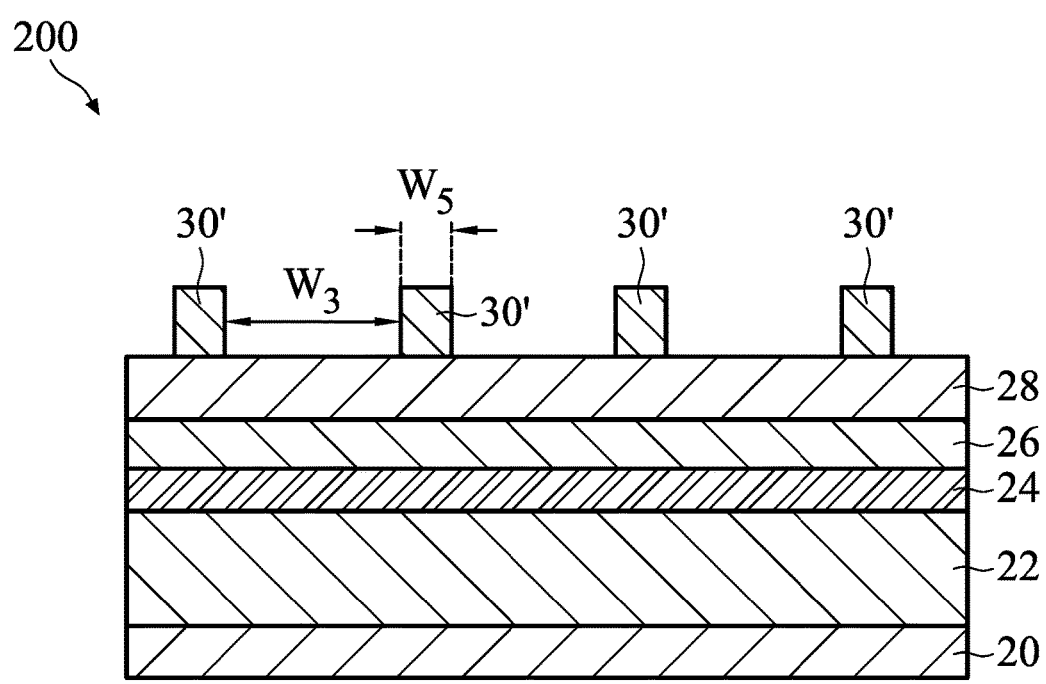

FIGS. 15A and 15B representatively illustrate patterning of hard mask layer 31 and mandrel layer 30 with spacers 42 to form mandrels 30'. Spacers 42 are used as a mask to pattern hard mask layer 31, which is used as a mask to pattern mandrel layer 30. In a representative embodiment, hard mask layer 31 may be patterned by a dry etch process with etch process gases including O$_2$, CO$_2$, C$_x$H$_y$F$_z$, Ar, N$_2$, H$_2$, or the like, a combination thereof, or any other suitable etchant system suitably configured to pattern hard mask layer 31. Remaining processing steps to form structure representatively illustrated in FIGS. 15A and 15B are similar to the process described above with respect to FIGS. 5A and 5B, and are not repeated herein for concision of description.

Intermediate structure of semiconductor device 200 representatively illustrated in FIGS. 15A and 15B may undergo further processing similar to processing steps representatively illustrated in FIG. 6A through to described above—details of which are not repeated herein for concision of description.

In an embodiment, a system includes: an at least partly aqueous system configured to remove at least one of carbon-containing silicon residue or nitrogen-containing silicon residue, the at least partly aqueous system including: a hydroxyl-terminated organic material; a first diol; and a fluoride ion donor material. The hydroxyl-terminated organic material may include at least one of the first diol, a second diol, or an alcohol. The alcohol may include at least one of 1-(2-hydroxyethyl)-2-pyrrolidone, 2-(hydroxymethoxy)ethanol, or diethylene glycol, and the first diol or the second diol may include at least one of ethylene glycol, propylene glycol, or diethylene glycol. The at least partly aqueous system may include the hydroxyl-terminated organic material in a range of about 5% weight/weight (wt/wt) to about 30% (wt/wt) of the at least partly aqueous system. The first diol may include diethylene glycol. The at least partly aqueous system may include the first diol in a range of about 2% (wt/wt) to about 5% (wt/wt) of the at least partly aqueous system. The fluoride ion donor material may include at least one of ammonium fluoride or ammonium bifluoride. The at least partly aqueous system may include the fluoride ion donor material in a range of about 0.2% (wt/wt) to about 0.5% (wt/wt) of the at least partly aqueous system. The hydroxyl-terminated organic material may include at least one of 1-(2-hydroxyethyl)-2-pyrrolidone, 2-(hydroxymethoxy)ethanol, or diethylene glycol. The first diol may include diethylene glycol. The fluoride ion donor material may include ammonium fluoride and ammonium bifluoride. The at least partly aqueous system may include: about 5% (wt/wt) to about 30% (wt/wt) the hydroxyl-terminated organic material; about 2% (wt/wt) to about 15% (wt/wt) the first diol; about 0.2% (wt/wt) to about 0.5% (wt/wt) the fluoride ion donor material; and about 54.5% (wt/wt) to about 92.8% (wt/wt) water.

Figure 16:
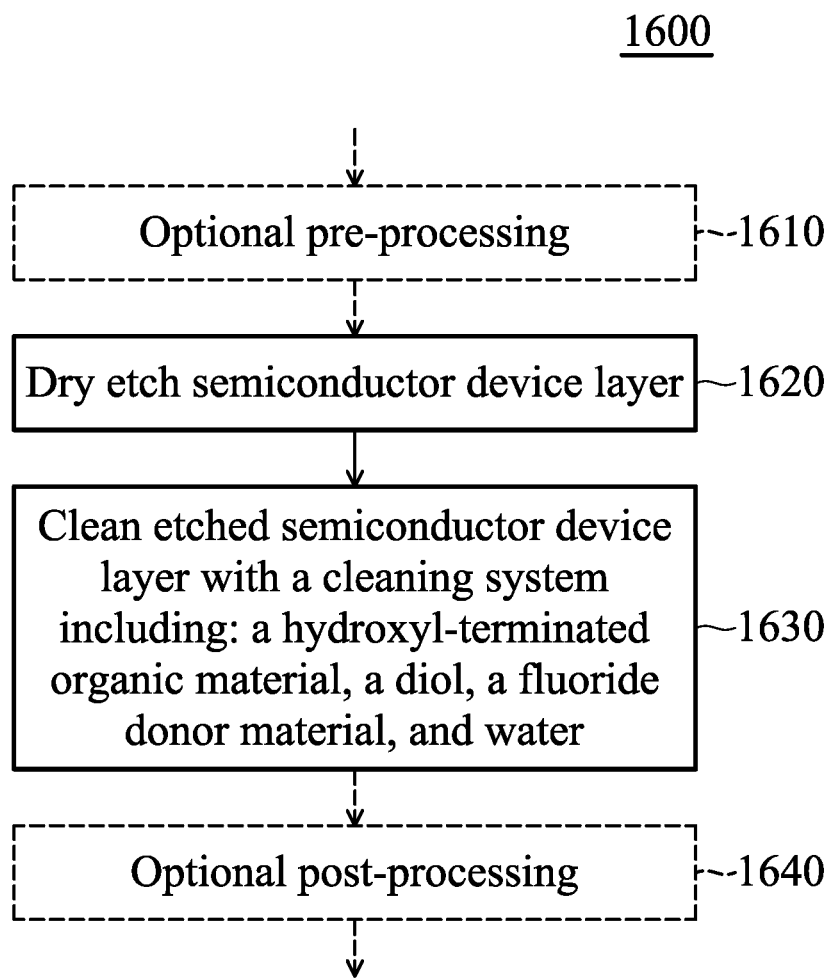
FIG. 16 illustrates a representative wet clean method for removal of carbon-containing or nitrogen-containing silicon residues, in accordance with an embodiment.

In another embodiment as representatively illustrated in FIG. 16, a method 1600 includes steps of: optional pre-processing 1610; etching 1620 a semiconductor device layer, wherein the etching produces at least one of a carbon-containing silicon residue or a nitrogen-containing silicon residue; after etching 1620 the semiconductor device layer, cleaning 1630 the semiconductor device layer to at least partially remove at least one of the carbon-containing silicon residue or the nitrogen-containing silicon residue with a cleaning system that includes: water; a hydroxyl-terminated organic material; a first diol; and a fluoride ion donor material; and optional post-processing 1640 (e.g., spacer definition followed by wet cleaning of defined spacer structures using dilute HF). The etching may be performed with a plasma that includes at least one of CO$_2$, C$_x$H$_y$F$_z$, or N$_2$. The hydroxyl-terminated organic material may include 1-(2-hydroxyethyl)-2-pyrrolidone, 2-(hydroxymethoxy)ethanol, or diethylene glycol. The first diol may include diethylene glycol. The first diol may comprise the hydroxyl-terminated organic material. The fluoride ion donor material may include ammonium fluoride and ammonium bifluoride. The cleaning system may include: about 5% weight/weight (wt/wt) to about 30% (wt/wt) of the hydroxyl-terminated organic material (e.g., 1-(2-hydroxyethyl)-2-pyrrolidone); about 2% (wt/wt) to about 15% (wt/wt) of the first diol (e.g., diethylene glycol); about 0.2% (wt/wt) to about 0.5% (wt/wt) the fluoride ion donor material; and about 54.5% (wt/wt) to about 92.8% (wt/wt) water. The cleaning may include at least partial removal of the at least one of the carbon-containing silicon residue or the nitrogen-containing silicon residue from a silicon-containing structure. The cleaning may be selective for at least partial removal of the at least one of the carbon-containing silicon residue or the nitrogen-containing silicon residue relative to material forming the silicon-containing structure. The cleaning may be selective for at least partial removal of the at least one of the carbon-containing silicon residue or the nitrogen-containing silicon residue relative to at least one of amorphous silicon or silicon oxide.

In yet another embodiment, a method includes steps of: dry etching a semiconductor structure with a plasma, the semiconductor structure including at least one of amorphous silicon or silicon oxide; the plasma including at least one of $CO_2$, $C_xH_yF_z$, or $N_2$, wherein the dry etching produces at least one of a carbon-containing silicon material or a nitrogen-containing silicon material; and after dry etching the semiconductor structure, reducing a concentration of at least one of the carbon-containing silicon material or the nitrogen-containing silicon material with an at least partially aqueous system that includes: a hydroxyl-terminated organic material; a first diol; and a fluoride ion donor material. The at least partially aqueous system may consist of: about 5% weight/weight (wt/wt) to about 30% (wt/wt) of the hydroxyl-terminated organic material (e.g., 1-(2-hydroxyethyl)-2-pyrrolidone or 2-(hydroxymethoxy)ethanol); about 2% (wt/wt) to about 15% (wt/wt) of the first diol (e.g., 1-(20hydroxyethyl)-2-pyrrolidone), 2-(hydroxymethoxy)ethanol), or diethylene glycol); about 0.2% (wt/wt) to about 92.8% (wt/wt) a combination of ammonium fluoride and ammonium bifluoride; and about 54.5% (wt/wt) to about 92.8% (wt/wt) water.

In still another embodiment, subsequent to a first wet clean after mandrel etching, a second wet clean (e.g., as optional post-processing 1640) may be performed after spacer etching (e.g., included in optional post-processing 1640) using a dilute HF solution (e.g., an about 1:2000 dilution with deionized water) for a duration of time of about 120 seconds at a temperature of about 50° C. Moreover, representative embodiments provide positive TEOS recession/loss of less than about 3 nm after spacer etching and second wet cleaning with dilute HF.

In yet another embodiment, a system for use in semiconductor device manufacture includes an at least partly aqueous system configured to remove at least one of carbon-containing silicon residue or nitrogen-containing silicon residue. The at least partly aqueous system includes a hydroxyl-terminated organic material and a fluoride ion donor material. The at least partly aqueous system further includes a diol or an alcohol.

Spatially relative terms, such as "beneath," "below," "lower," "above," "upper," and the like, may be used herein for ease of description to describe an element or feature's relationship to another element or feature as representatively illustrated in the figures. Spatially relative terms are intended to encompass different orientations of devices in use or operation in addition to the orientation illustrated in the figures. Apparatuses may be otherwise oriented (e.g., rotated 90 degrees, or at other orientations) and the spatially relative descriptors used herein may likewise be interpreted accordingly.

As used herein, the terms "comprises," "comprising," "includes," "including," "has," "having," or any contextual variant thereof, are intended to reference a non-exclusive inclusion. For example, a process, product, article, or apparatus that comprises a list of elements is not necessarily limited to only those elements, but may include other elements not expressly listed or inherent to such process, product, article, or apparatus. Furthermore, unless expressly stated to the contrary, "or" refers to an inclusive or and not an exclusive or. That is, the term "or," as used herein, is generally intended to mean "and/or" unless otherwise indicated. For example, a condition "A or B" is satisfied by any one of the following: A is true (or present) and B is false (or not present), A is false (or not present) and B is true (or present), and both A and B are true (or present). As used herein, a term preceded by "a" or "an" (and "the" when antecedent basis is "a" or "an") includes both singular and plural connotations for such term, unless the context clearly indicates otherwise.

It will also be appreciated that one or more elements illustrated in the Figures may also be implemented in a more-separated or more-integrated manner, or even removed or rendered inoperable in certain cases, as may be useful in accordance with particular applications and embodiments. Additionally, any arrows in the Figures should be considered only as representative, and therefore not limiting, unless otherwise specifically noted.

Examples or illustrations provided herein are not to be regarded in any way as restrictions on, limits to, or express definitions of any term or terms with which they are associated. Instead, these examples or illustrations are to be regarded as being described with respect to a particular embodiment and as merely illustrative. Those skilled in the art will appreciate that any term or terms with which these examples or illustrations are associated will encompass other embodiments that may or may not be given therewith or elsewhere in the specification, and all such embodiments are intended to be included within the scope of that term or terms. Language designating such non-limiting examples and illustrations includes, but is not limited to: "for example," "for instance," "e.g.," "etc.," "or the like," "in a representative embodiment," "in one embodiment," "in another embodiment," or "in some embodiments." Reference throughout this specification to "one embodiment," "an embodiment," "a representative embodiment," "a particular embodiment," or "a specific embodiment," or contextually similar terminology, means that a particular feature, structure, property, or characteristic described in connection with the described embodiment is included in at least one embodiment, but may not necessarily be present in all embodiments. Thus, respective appearances of the phrases "in one embodiment," "in an embodiment," or "in a specific embodiment," or similar terminology in various places throughout the description are not necessarily referring to the same embodiment. Furthermore, particular features, structures, properties, or characteristics of any specific embodiment may be combined in any suitable manner with one or more other embodiments.

Benefits, other advantages, and solutions to problems have been described herein with regard to representative embodiments. However, any benefits, advantages, solutions to problems, or any component thereof that may cause any benefit, advantage, or solution to occur or to become more pronounced are not to be construed as critical, required, or essential features or components.

Although representative embodiments and advantages have been described herein, it should be understood that various changes, substitutions, or alterations can be made without departing from the spirit and scope of the disclosure as defined by the appended claims. Moreover, the scope of the present description is not intended to be limited to particular embodiments of any specific process, machine, article of manufacture, composition of matter, means, methods, or steps described in the specification. As one of ordinary skill in the art will appreciate from the disclosure, various processes, machines, articles of manufacture, compositions of matter, means, methods, or steps, presently existing or later developed, that perform substantially the same function or achieve a substantially similar result as corresponding embodiments described herein may be uti-

What is claimed is:

1. A system for use in semiconductor device manufacture, the system comprising:
   an at least partly aqueous system configured to remove at least one of carbon-containing silicon residue or nitrogen-containing silicon residue, the at least partly aqueous system comprising:
   water in a range of about 54.5% (wt/wt) to about 92.8% (wt/wt);
   1-(2-hydroxyethyl)-2-pyrrolidone in a range of about % (wt/wt) to about 30% (wt/wt);
   a mixture of ammonium fluoride and ammonium bifluoride in a range of about 0.2% (wt/wt) to about 92.8% (wt/wt); and
   diethylene glycol in about 2% (wt/wt) to about 15% (wt/wt).

2. The system of claim 1, wherein the at least partly aqueous system comprises the mixture of ammonium fluoride and ammonium bifluoride in a range of about 0.2% (wt/wt) to about 0.5% (wt/wt) of the at least partly aqueous system.

3. The system of claim 1, wherein the at least partially aqueous system further comprises a pH between about 4.5 and about 5.5.

4. The system of claim 1, wherein the at least partially aqueous system further comprises a buffer.

5. The system of claim 4, the buffer being monoethanolamine (MEA).

6. The system of claim 5, wherein the pH is about 5.3.

7. A method for use in semiconductor device manufacture, the method comprising:
   etching a semiconductor device layer, wherein the etching produces at least one of a carbon-containing silicon residue or a nitrogen-containing silicon residue; and
   after etching the semiconductor device layer, cleaning the semiconductor device layer to at least partially remove at least one of the carbon-containing silicon residue or the nitrogen-containing silicon residue with a cleaning system comprising:
   water in a range of about 54.5% (wt/wt) to about 92.8% (wt/wt);
   a hydroxyl-terminated organic material comprising 1-(2-hydroxyethyl)-2-pyrrolidone in a range of about 5% (wt/wt) to about 30% (wt/wt);
   a diol comprising diethylene glycol in a range of about 2% (wt/wt) to about 15% (wt/wt); and
   a fluoride ion donor material comprising a combination of ammonium fluoride and ammonium bifluoride in a range of about 0.2% (Wt/Wt) to about 92.8% (wt/wt).

8. The method of claim 7, wherein the etching is performed with a plasma comprising at least $C_xH_yF_z$.

9. The method of claim 7, wherein the semiconductor device layer comprises amorphous silicon.

10. The method of claim 7, wherein the cleaning the semiconductor device layer further comprises a cleaning time of between about 60 seconds and about 600 seconds at a temperature of between about 30° C. and about 70° C.

11. The method of claim 7, wherein the etching is performed with a plasma comprising $N_2$.

12. The method of claim 11, wherein the cleaning comprises at least partial removal of the at least one of the carbon-containing silicon residue or the nitrogen-containing silicon residue from a silicon-containing structure.

13. The method of claim 12, wherein the cleaning is selective for at least partial removal of the at least one of the carbon-containing silicon residue or the nitrogen-containing silicon residue relative to material forming the silicon-containing structure.

14. The method of claim 13, wherein the cleaning is selective for at least partial removal of the at least one of the carbon-containing silicon residue or the nitrogen-containing silicon residue relative to at least one of amorphous silicon or silicon oxide.

15. A method for use in semiconductor device manufacture, the method comprising:
   dry etching a semiconductor structure with a plasma, the semiconductor structure comprising at least one of amorphous silicon or silicon oxide; the plasma comprising at least one of $CO_2$, $C_xH_yF_z$, or $N_2$, wherein the dry etching produces at least one of a carbon-containing silicon material or a nitrogen-containing silicon material; and
   after dry etching the semiconductor structure, reducing a concentration of at least one of the carbon-containing silicon material or the nitrogen-containing silicon material with an at least partially aqueous system consisting of:
   about 5% (wt/wt) to about 30% (wt/wt) 1-(2-hydroxyethyl)-2-pyrrolidone;
   about 2% (wt/wt) to about 15% (wt/wt) diethylene glycol;
   about 0.2% (wt/wt) to about 92.8% (wt/wt) a combination of ammonium fluoride and ammonium bifluoride; and
   about 54.5% (wt/wt) to about 92.8% (wt/wt) water.

16. The method of claim 15, wherein the reducing the concentration of at least one of the carbon-containing silicon material or the nitrogen-containing silicon material reduces the amount of carbon by a factor of at least about 3.

17. The method of claim 15, wherein the semiconductor structure comprises a hard mask layer.

18. The method of claim 17, wherein the hard mask layer is formed to have a thickness from about 100 Angstroms to about 1000 Angstroms.

19. The method of claim 15, wherein the dry etching the semiconductor structure comprises forming mandrels, such that the carbon-containing silicon material or the nitrogen-containing silicon material is produced on or in surface portions of the mandrels.

20. The method of claim 19, wherein the at least partially aqueous system comprises a water ratio of about 60%.

* * * * *